(12) United States Patent
Hara et al.

(10) Patent No.: US 11,004,478 B2
(45) Date of Patent: May 11, 2021

(54) SEMICONDUCTOR MEMORY DEVICE

(71) Applicant: Kioxia Corporation, Minato-ku (JP)

(72) Inventors: Hiroyuki Hara, Fujisawa (JP); Atsushi Kawasumi, Fujisawa (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/806,053

(22) Filed: Mar. 2, 2020

(65) Prior Publication Data
US 2021/0082476 A1 Mar. 18, 2021

(30) Foreign Application Priority Data

Sep. 18, 2019 (JP) .............................. JP2019-169909

(51) Int. Cl.
*G11C 5/06* (2006.01)
*G11C 5/14* (2006.01)
(Continued)

(52) U.S. Cl.
CPC .............. *G11C 5/063* (2013.01); *G11C 5/147* (2013.01); *G11C 13/0038* (2013.01);
(Continued)

(58) Field of Classification Search
CPC ..... G11C 5/063; G11C 5/147; G11C 13/0038; H01L 23/528; H01L 27/2463; H01L 45/1233
See application file for complete search history.

(56) References Cited

U.S. PATENT DOCUMENTS 10,879,313 B2 * 12/2020 Takahashi ............ H01L 27/2481
2013/0237028 A1 * 9/2013 Furuhashi ................ H01L 45/16
438/382

(Continued)

*Primary Examiner* — Han Yang
(74) *Attorney, Agent, or Firm* — Oblon, McClelland, Maier & Neustadt, L.L.P.

(57) ABSTRACT

A semiconductor memory device according to an embodiment includes: a substrate having a substrate plane extending in a first direction and a second direction intersecting with the first direction; a first wiring provided above the substrate, the first wiring being provided so that a longitudinal direction extends along the first direction; a second wiring provided above the substrate, the second wiring being separated from the first wiring in the first direction, the second wiring being passed by the same virtual line together with the first wiring, the second wiring being provided so that a longitudinal direction extends along the first direction; a third wiring provided between the first wiring and the second wiring, the third wiring being separated from the first wiring and the second wiring, the third wiring being passed by the same virtual line together with the first wiring and the second wiring, the third wiring being provided so that a longitudinal direction extends along the first direction; a fourth wiring provided above the first wiring, the fourth wiring overlapping with the first wiring when viewed from the above, the fourth wiring being provided so that a longitudinal direction extends along the first direction; a fifth wiring provided over the second wiring and the third wiring, the fifth wiring being separated from the fourth wiring in the first direction, the fifth wiring overlapping with the second wiring and the third wiring when viewed from the above, the fifth wiring being passed by the same virtual line together with the fourth wiring, the fifth wiring being provided so that a longitudinal direction extends along the first direction; a sixth wiring provided over the fourth wiring and the fifth wiring, the sixth wiring overlapping with the fourth wiring and the fifth wiring when viewed from the above, the sixth wiring being provided so that a longitudinal direction extends along the first direction; a plurality of seventh wirings provided between the first wiring and the fourth wiring, between the third wiring and the fifth wiring, and between the second wiring and the fifth wiring, the seventh wirings being provided so that a longitudinal direction (Continued)

extends along the second direction; a plurality of eighth wirings provided between the fourth wiring and the sixth wiring and between the fifth wiring and the sixth wiring, the eighth wirings being provided so that a longitudinal direction extends along the second direction; a plurality of first memory cells provided between the first wiring, the second wiring, and the third wiring and the seventh wirings; a plurality of second memory cells provided between the fourth wiring and the seventh wirings and between the fifth wiring and the seventh wirings, the second memory cells overlapping with the first memory cells when viewed from the above; a plurality of third memory cells provided between the fourth wiring and the eighth wirings and between the fifth wiring and the eighth wirings, the third memory cells overlapping with the second memory cells when viewed from the above; a plurality of fourth memory cells provided between the sixth wiring and the eighth wirings, the fourth memory cells overlapping with the third memory cells when viewed from the above; a first connection wiring provided above the substrate, the first connection wiring being provided at least partially under a portion where the first wiring and the third wiring are separated; a second connection wiring provided between the first wiring and the third wiring so that a longitudinal direction extends along a third direction intersecting with the first direction and the second direction, the second connection wiring connecting the sixth wiring and the first connection wiring; a third connection wiring configured to connect the first wiring and the first connection wiring; a fourth connection wiring configured to connect the third wiring and the first connection wiring; a fifth connection wiring provided above the substrate, the fifth connection wiring being provided at least partially under a portion where the second wiring and the third wiring are separated; and a sixth connection wiring provided between the second wiring and the third wiring so that a longitudinal direction extends along the third direction, the sixth connection wiring connecting the fifth wiring and the fifth connection wiring.

13 Claims, 24 Drawing Sheets

(51) Int. Cl.
  *G11C 13/00* (2006.01)
  *H01L 27/24* (2006.01)
  *H01L 45/00* (2006.01)
  *H01L 23/528* (2006.01)
(52) U.S. Cl.
  CPC ........ *H01L 23/528* (2013.01); *H01L 27/2463* (2013.01); *H01L 45/1233* (2013.01)

(56) References Cited

U.S. PATENT DOCUMENTS

2019/0050169 A1 2/2019 Komai
2019/0172502 A1* 6/2019 Jeong ................ G11C 13/0028

* cited by examiner

US 11,004,478 B2

SEMICONDUCTOR MEMORY DEVICE

CROSS-REFERENCE TO RELATED APPLICATION

This application is based upon and claims the benefit of priority from Japanese Patent Application No. 2019-169909, filed on Sep. 18, 2019, the entire contents of which are incorporated herein by reference.

FIELD

Embodiments described herein relate generally to a semiconductor memory device.

BACKGROUND

A cross-point type memory device using a variable resistive element as a memory cell array attracts attention as being capable of easily realizing a large-capacity memory device as compared with the conventional case.

In the cross-point type memory device, a large number of wirings called bit lines and word lines are crossed and arranged, and a memory cell is formed at an intersection of a bit line and a word line. Writing to one memory cell is performed by applying a voltage or a current to the bit line and the word line connected to the memory cell.

DETAILED DESCRIPTION

Figure 1:
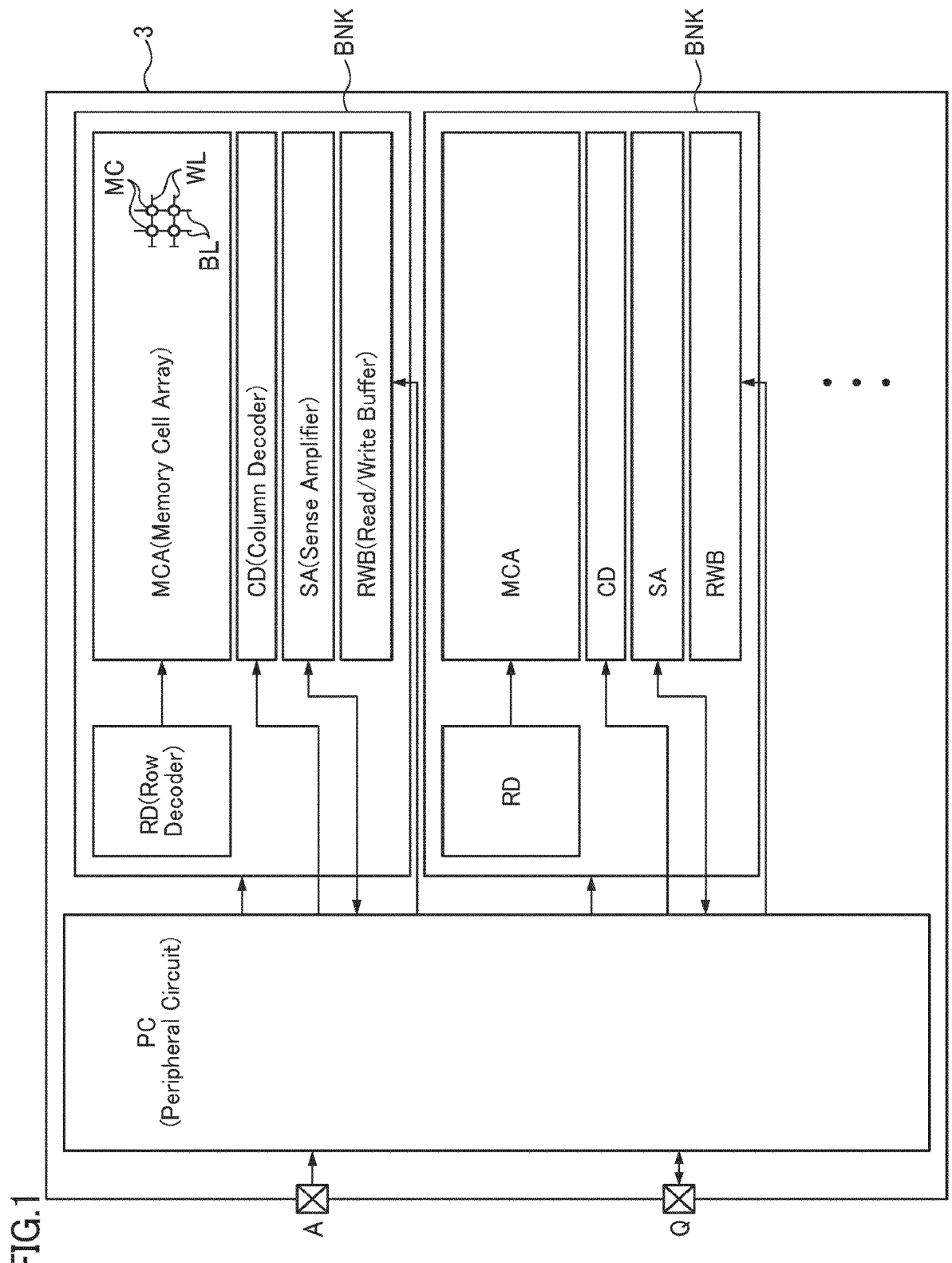
FIG. 1 is a block diagram showing a configuration of a memory system according to a first embodiment.

Hereinafter, embodiments will be described using the drawings. In the drawings, the same or similar parts are denoted by the same or similar reference numerals.

In the present specification, in order to indicate a positional relation of components and the like, an upward direction of the drawings is described as "above" and a downward direction of the drawings is described as "under".

In the present specification, the concepts of "above" and "under" are not necessarily terms indicating relations with a direction of gravity.

First Embodiment

A semiconductor memory device according to the present embodiment includes: a substrate having a substrate plane extending in a first direction and a second direction intersecting with the first direction; a first wiring provided above the substrate, the first wiring being provided so that a longitudinal direction extends along the first direction; a second wiring provided above the substrate, the second wiring being separated from the first wiring in the first direction, the second wiring being passed by the same virtual line together with the first wiring, the second wiring being provided so that a longitudinal direction extends along the first direction; a third wiring provided between the first wiring and the second wiring, the third wiring being separated from the first wiring and the second wiring, the third wiring being passed by the same virtual line together with the first wiring and the second wiring, the third wiring being provided so that a longitudinal direction extends along the first direction; a fourth wiring provided above the first wiring, the fourth wiring overlapping with the first wiring when viewed from the above, the fourth wiring being provided so that a longitudinal direction extends along the first direction; a fifth wiring provided over the second wiring and the third wiring, the fifth wiring being separated from the fourth wiring in the first direction, the fifth wiring overlapping with the second wiring and the third wiring when viewed from the above, the fifth wiring being passed by the same virtual line together with the fourth wiring, the fifth wiring being provided so that a longitudinal direction extends along the first direction; a sixth wiring provided over the fourth wiring and the fifth wiring, the sixth wiring overlapping with the fourth wiring and the fifth wiring when viewed from the above, the sixth wiring being provided so that a longitudinal direction extends along the first direction; a plurality of seventh wirings provided between the first wiring and the fourth wiring, between the third wiring and the fifth wiring, and between the second wiring and the fifth wiring, the seventh wirings being provided so that a longitudinal direction extends along the second direction; a plurality of eighth wirings provided between the fourth wiring and the sixth wiring and between the fifth wiring and the sixth wiring, the eighth wirings being provided so that a longitudinal direction extends along the second direction; a plurality of first memory cells provided between the first wiring, the second wiring, and the third wiring and the seventh wirings; a plurality of second memory cells provided between the fourth wiring and the seventh wirings and between the fifth wiring and the seventh wirings, the second memory cells overlapping with the first memory cells when viewed from the above; a plurality of third memory cells provided between the fourth wiring and the eighth wirings and between the fifth wiring and the eighth wirings, the third memory cells overlapping with the second memory cells when viewed from the above; a plurality of fourth memory cells provided between the sixth wiring and the eighth wirings, the fourth memory cells overlapping with the third memory cells when viewed from the above; a first connection wiring provided above the substrate, the first connection wiring being provided at least partially under a portion where the first wiring and the third wiring are separated; a second connection wiring provided between the first wiring and the third wiring so that a longitudinal direction extends along a third direction intersecting with the first direction and the second direction, the second connection wiring connecting the sixth wiring and the first connection wiring; a third connection wiring configured to connect the first wiring and the first connection wiring; a fourth connection wiring configured to connect the third wiring and the first connection wiring; a fifth connection wiring provided above the substrate, the fifth connection wiring being provided at least partially under a portion where the second wiring and the third wiring are separated; and a sixth connection wiring provided between the second wiring and the third wiring so that a longitudinal direction extends along the third direction, the sixth connection wiring connecting the fifth wiring and the fifth connection wiring.

The semiconductor memory device according to the present embodiment further includes: a ninth wiring provided to be separated from the fourth wiring in the second direction; a tenth wiring provided to be separated from the ninth wiring in the second direction, the ninth wiring being provided between the fourth wiring and the tenth wiring; an eleventh wiring provided to be separated from the tenth wiring in the second direction, the tenth wiring being provided between the eleventh wiring and the ninth wiring; a twelfth wiring provided to be separated from the fifth wiring in the second direction and to be separated from the ninth wiring in the first direction; a thirteenth wiring provided to be separated from the twelfth wiring in the second direction and to be separated from the tenth wiring in the first direction, the twelfth wiring being provided between the fifth wiring and the thirteenth wiring; a fourteenth wiring provided to be separated from the thirteenth wiring in the second direction and to be separated from the eleventh wiring in the first direction, the thirteenth wiring being provided between the twelfth wiring and the fourteenth wiring; a fifteenth wiring provided over the ninth wiring and the twelfth wiring, the fifteenth wiring overlapping with the ninth wiring and the twelfth wiring when viewed from the above, the fifteenth wiring being provided above the eighth wirings, the fifteenth wiring being provided so that a longitudinal direction extends along the first direction; a sixteenth wiring provided over the tenth wiring and the thirteenth wiring, the sixteenth wiring overlapping with the tenth wiring and the thirteenth wiring when viewed from the above, the sixteenth wiring being provided above the eighth wirings, the sixteenth wiring being provided so that a longitudinal direction extends along the first direction; a seventeenth wiring provided over the eleventh wiring and the fourteenth wiring, the seventeenth wiring overlapping with the eleventh wiring and the fourteenth wiring when viewed from the above, the seventeenth wiring being provided above the eighth wirings, the seventeenth wiring being provided so that a longitudinal direction extends along the first direction; an eighteenth wiring provided between the substrate and the ninth wiring, the eighteenth wiring overlapping with the ninth wiring when viewed from the above, the eighteenth wiring being provided to be separated from the first wiring in the second direction; a nineteenth wiring provided between the substrate and the tenth wiring, the nineteenth wiring overlapping with the tenth wiring when viewed from the above, the nineteenth wiring being provided to be separated from the eighteenth wiring in the second direction; a twentieth wiring provided between the substrate and the eleventh wiring, the twentieth wiring overlapping with the eleventh wiring when viewed from the above, the twentieth wiring being provided to be separated from the nineteenth wiring in the second direction; a twenty-first wiring provided between the substrate and the twelfth wiring, the twenty-first wiring overlapping with the twelfth wiring when viewed from the above, the twenty-first wiring being provided to be separated from the third wiring in the second direction, the twenty-first wiring being provided under a portion where the ninth wiring and the twelfth wiring are separated, the twenty-first wiring being provided to be separated from the eighteenth wiring in the first direction; a twenty-second wiring provided between the substrate and the thirteenth wiring, the twenty-second wiring overlapping with the thirteenth wiring when viewed from the above, the twenty-second wiring being provided to be separated from the twenty-first wiring in the second direction, the twenty-second wiring being provided under a portion where the tenth wiring and the thirteenth wiring are separated, the twenty-second wiring being provided to be separated from the nineteenth wiring in the first direction; a twenty-third wiring provided between the substrate and the fourteenth wiring, the twenty-third wiring overlapping with the fourteenth wiring when viewed from the above, the twenty-third wiring being provided to be separated from the twenty-second wiring in the second direction, the twenty-third wiring being provided under a portion where the eleventh wiring and the fourteenth wiring are separated, the twenty-third wiring being provided to be separated from the twentieth wiring in the first direction; an eighth connection wiring provided above the substrate, the eighth connection wiring being provided at least partially under a portion where the eighteenth wiring and the twenty-first wiring are separated; a ninth connection wiring provided between the ninth wiring and the twelfth wiring so that a longitudinal direction extends along the third direction, the ninth connection wiring connecting the fifteenth wiring and the eighth connection wiring; a tenth connection wiring configured to connect the eighteenth wiring and the eighth connection wiring; an eleventh connection wiring configured to connect the twenty-first wiring and the eighth connection wiring; a twelfth connection wiring provided above the substrate, the twelfth connection wiring being provided at least partially under a portion where the nineteenth wiring and the twenty-second wiring are separated; a thirteenth connection wiring provided between the tenth wiring and the thirteenth wiring so that a longitudinal direction extends along the third direction, the thirteenth connection wiring connecting the sixteenth wiring and the twelfth connection wiring; a fourteenth connection wiring configured to connect the nineteenth wiring and the twelfth connection wiring; a fifteenth connection wiring configured to connect the twenty-second wiring and the twelfth connection wiring; a sixteenth connection wiring provided above the substrate, the sixteenth connection wiring being provided at least partially under a portion where the twentieth wiring and the twenty-third wiring are separated; a seventeenth connection wiring provided between the eleventh wiring and the fourteenth wiring so that a longitudinal direction extends along the third direction, the seventeenth connection wiring connecting the seventeenth wiring and the sixteenth connection wiring; an eighteenth connection wiring configured to connect the twentieth wiring and the sixteenth connection wiring; and a nineteenth connection wiring configured to connect the twenty-third wiring and the sixteenth connection wiring.

FIG. 1 is a block diagram showing a configuration of a memory system 3 according to the present embodiment.

A semiconductor memory device according to the present embodiment is, for example, a volatile memory such as a dynamic random access memory (DRAM) or a nonvolatile memory such as a NAND type electrically erasable and programmable read-only memory (EEPROM), a resistive RAM (ReRAM), and a magnetoresistive RAM (MRAM).

The memory system 3 shown in FIG. 1 includes a memory cell array MCA, a column decoder CD, a row decoder RD, a sense amplifier SA, a read/write buffer RWB, and a peripheral circuit PC.

The memory cell array MCA includes a plurality of memory cells MC two-dimensionally arranged in a matrix, for example. The memory cell MC is, for example, a resistance change type memory such as ReRAM. For example, the memory cell MC is disposed at an intersection of a bit line BL and a word line WL. That is, the memory cell array MCA is a so-called cross-point type memory cell array. The bit line BL is substantially orthogonal to (substantially intersects with) the word line WL, when viewed from the above or the side of the semiconductor substrate. Each of a plurality of bit lines BL is connected to one end of each memory cell MC of the memory cell array MCA. Each of a plurality of word lines WL is connected to a gate terminal of each memory cell MC of the memory cell array MCA. The memory cell array MCA is divided into a plurality of banks BNK in one chip, and a sense amplifier SA, a data latch DL, an address latch AL, and the like are provided for each bank BNK.

For example, the sense amplifier SA is connected to the memory cell MC via the bit line BL, and applies a write voltage or a read voltage to the memory cell MC via the bit line BL. The sense amplifier SA writes data to the memory cell MC by applying the write voltage to the memory cell MC, or reads data from the memory cell MC by applying the read voltage to the memory cell MC.

The read/write buffer RWB temporarily holds the data or the address detected by the sense amplifier SA for each page, or temporarily holds the data or the address to be written to the memory cell array MCA for each page.

The row decoder RD and the column decoder CD access the memory cell array MCA on the basis of a bank address or a page address, and apply the write voltage or the read voltage to the word line WL or the bit line BL. The row decoder RD applies the write voltage or the read voltage to a selected word line selected from the plurality of word lines WL. The column decoder CD connects a selected bit line selected from the plurality of bit lines BL to the sense amplifier SA. The sense amplifier SA applies the write voltage or the read voltage to the selected bit line. In this way, the memory system 3 can write data to a desired memory cell MC in the bank BNK or read data from the desired memory cell MC.

Figure 2:
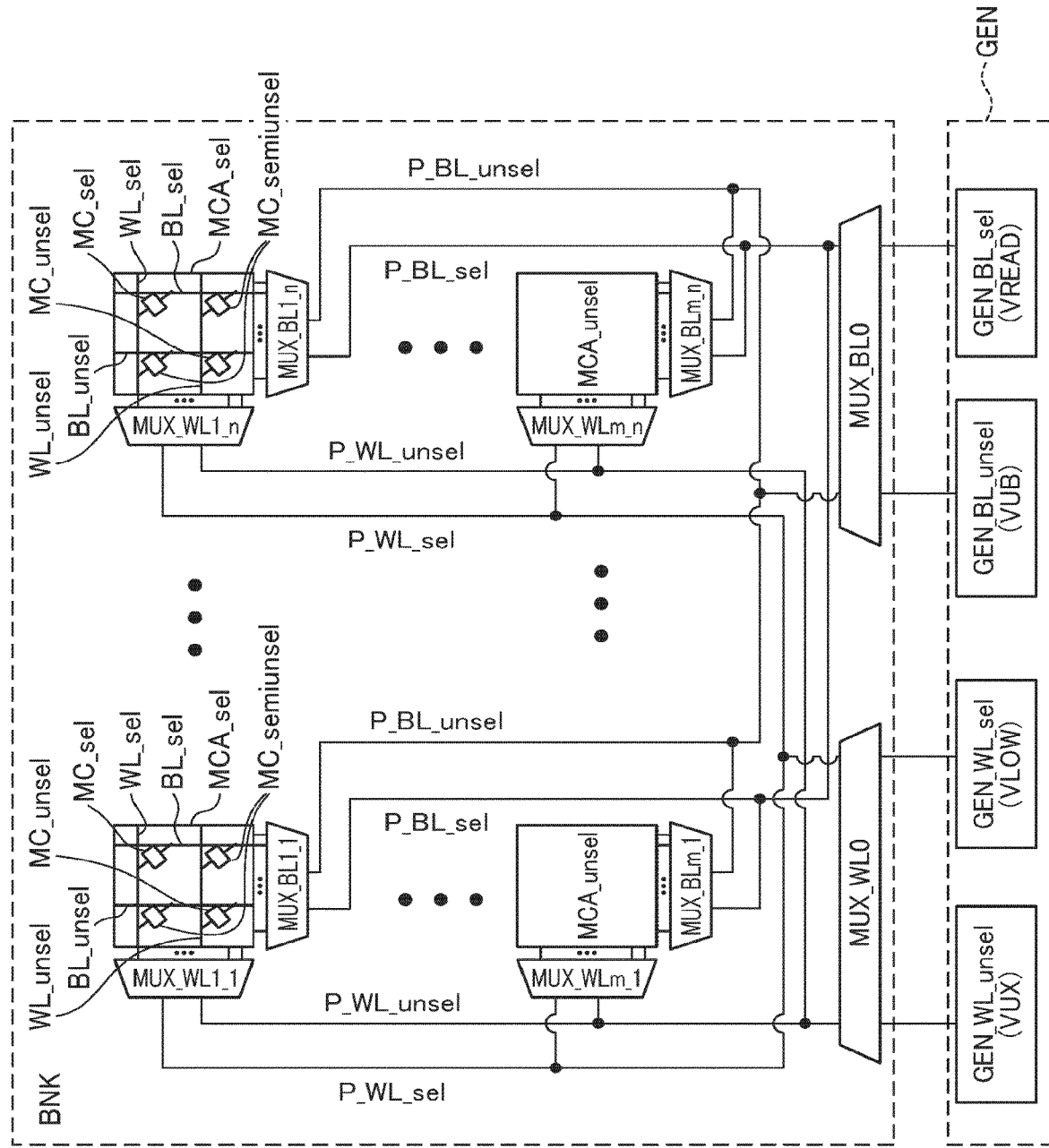
FIG. 2 is a block diagram showing a detailed configuration example of a bank BNK, a column decoder CD, and a row decoder RD in the first embodiment.

The peripheral circuit PC includes a voltage generation circuit, a read/write engine, an address controller, a command controller, and an input/output circuit (not shown in the drawings), for example. A voltage generation circuit GEN generates a voltage of the word line WL or a voltage of the bit line BL necessary for a data read operation and a data write operation. A more detailed configuration of the voltage generation circuit GEN is shown in FIG. 2. The read/write engine controls the column decoder CD and the row decoder RD to write data to the desired memory cell MC in the bank BNK, according to a command and an address, or reads data from the desired memory cell MC in the bank BNK. The read/write engine transfers read data to a DQ buffer of the input/output circuit. The address controller receives a row address and a column address and decodes these addresses. The command controller receives commands indicating various operations such as a data read operation and a data write operation and transfers these commands to the read/write engine. The input/output circuit (IO) captures the command and the address from a CA terminal CA, transfers the command to the command controller, and transfers the address to the address controller. The command may be a write command indicating the write operation or a read command indicating the read operation. The address may be a bank address indicating any bank BNK of the memory cell array MCA and an address indicating a page or a memory cell MC of a read or write target in the bank BNK. Further, the input/output circuit captures the write data from the DQ terminal and transfers the write data to the read/write buffer RWB. Alternatively, the input/output circuit receives the read data held in the data latch DL and outputs the read data from the DQ terminal.

A memory controller (not shown in the drawings) that wholly controls a plurality of memory systems 3 may be provided outside the memory system 3.

FIG. 2 is a block diagram showing a more detailed configuration example of the bank BNK, the column decoder CD, and the row decoder RD. The bank BNK configures the memory cell array MCA. However, the bank BNK includes a plurality of memory cell arrays that are subdivided to correspond to multiplexers MUX_BL1_1 to MUX_BLm_n and MUX_WL1_1 to MUX_WLm_n. Hereinafter, the subdivided memory cell array is referred to as MCA.

The memory system 3 includes the memory cell array MCA, multiplexers MUX_BL1_1 to MUX_BLm_n and MUX_BL0 functioning as the column decoder CD, multiplexers MUX_WL1_1 to MUX_WLm_n and MUX_WL0 functioning as the row decoder RD, bit line paths P_BL_sel and P_BL_unsel, word line paths P_WL_sel and P_WL_unsel, a selected BL voltage generation circuit GEN_BL_sel, an unselected BL voltage generation circuit GEN_BL_unsel, a selected WL voltage generation circuit GEN_WL_sel, and an unselected WL voltage generation circuit GEN_WL_unsel.

The multiplexer is configured using a switching element such as a metal oxide semiconductor field effect transistor (MOSFET).

The column decoder CD functioning as a first decoder includes the multiplexers MUX_BL1_1 to MUX_BLm_n and MUX_BL0. The multiplexers MUX_BL1_1 to MUX_BLm_n are provided to correspond to the memory cell arrays MCA, and are connected to the plurality of bit lines BL of the respective memory cell arrays MCA. Note that each of m and n is an integer of 1 or more. The multiplexers MUX_BL1_1 to MUX_BLm_n connect one selected bit line BL_sel selected from the bit lines BL of the corresponding memory cell arrays MCA to the selected bit line path P_BL_sel and apply a selected bit line voltage VREAD. The multiplexers MUX_BL1_1 to MUX_BLm_n connect the unselected bit lines BL_unsel other than the selected bit line BL_sel to the unselected bit line paths P_BL_unsel and apply an unselected bit line voltage VUB. Alternatively, the multiplexers MUX_BL1_1 to MUX_BLm_n set the unselected bit lines BL_unsel to a floating state and do not apply a voltage.

The multiplexer MUX_BL0 is connected between the selected BL voltage generation circuit GEN_BL_sel and a plurality of bit line paths and between the unselected BL voltage generation circuit GEN_BL_unsel and the plurality of bit line paths. The multiplexer MUX_BL0 connects one selected bit line path among the plurality of bit line paths as the selected bit line path P_BL_sel to the selected BL voltage generation circuit GEN_BL_sel. On the other hand, the multiplexer MUX_BL0 connects the unselected bit line path among the plurality of bit line paths as P_BL_unsel to the unselected BL voltage generation circuit GEN_BL_unsel.

The bit line paths P_BL_sel and P_BL_unsel are wiring paths connected between the multiplexers MUX_BL1_1 to MUX_BLm_n and the multiplexer MUX_BL0. For example, 32 or 64 bit line paths are provided. As described above, the multiplexer MUX_BL0 selects one of the plurality of bit line paths and connects the selected bit line path P_BL_sel to the selected BL voltage generation circuit GEN_BL_sel. The selected bit line path P_BL_sel transmits the selected bit line voltage VREAD. On the other hand, the multiplexer MUX_BL0 connects the unselected bit line path P_BL_unsel among the plurality of bit line paths to the unselected BL voltage generation circuit GEN_BL_unsel. The bit line path P_BL_unsel transmits the unselected bit line voltage VUB. The selected BL voltage generation circuit GEN_BL_sel functioning as a first power supply circuit generates the selected bit line voltage VREAD to be applied to the selected bit line BL_sel, from an external power supply. The selected bit line voltage VREAD is a high-level voltage, and is, for example, several volts. The selected bit line path P_BL_sel transmits the selected bit line voltage VREAD from the multiplexer MUX_BL0 to the multiplexers MUX_BL1_1 to MUX_BLm_n. The multiplexers MUX_BL1_1 to MUX_BLm_n and MUX_BL0 functioning as the first decoder electrically connect the selected bit line BL_sel among the plurality of bit lines BL to the selected BL voltage generation circuit GEN_BL_sel via the selected bit line path P_BL_sel, and selectively apply the selected bit line voltage VREAD to the selected bit line BL_sel.

The unselected BL voltage generation circuit GEN_BL_unsel functioning as a second power supply circuit generates the unselected bit line voltage VUB to be applied to the unselected bit line BL_unsel, from an external power supply. The unselected bit line voltage VUB is a voltage between the selected bit line voltage VREAD and a selected word line voltage VLOW, and is, for example, VREAD/2. The unselected bit line path P_BL_unsel transmits the unselected bit line voltage VUB from the multiplexer MUX_BL0 to the multiplexers MUX_BL1_1 to MUX_BLm_n. The multiplexers MUX_BL0 and MUX_BL1_1 to MUX_BLm_n functioning as the first decoder electrically connect the unselected bit line BL_unsel to the unselected BL voltage generation circuit GEN_BL_unsel via the unselected bit line path P_BL_unsel, and selectively apply the unselected bit line voltage VUB to the unselected bit line BL_unsel. Alternatively, the multiplexers MUX_BL0 and MUX_BL1_1 to MUX_BLm_n do not apply a voltage to the unselected bit line BL_unsel.

The row decoder RD functioning as the second decoder includes the multiplexers MUX_WL1_1 to MUX_WLm_n and MUX_WL0. The multiplexers MUX_WL1_1 to MUX_WLm_n are provided to correspond to the memory cell arrays MCA, and are connected to the plurality of word lines WL of the respective memory cell arrays MCA. The multiplexers MUX_WL1_1 to MUX_WLm_n connect one selected word line WL_sel selected from the word lines WL of the corresponding memory cell arrays MCA to the word line path P_WL_sel and apply a selected word line voltage VLOW. The multiplexers MUX_WL1_1 to MUX_WLm_n connect the unselected word lines WL_unsel other than the selected word line WL_sel to the word line paths P_WL_unsel and apply an unselected word line voltage VUX. The multiplexer MUX_WL0 is connected between the selected WL voltage generation circuit GEN_WL_sel and a plurality of word line paths and between the unselected WL voltage generation circuit GEN_WL_unsel and the plurality of word line paths. The multiplexer MUX_WL0 connects one selected word line path among the plurality of word line paths as P_WL_sel to the selected WL voltage generation circuit GEN_WL_sel. On the other hand, the multiplexer MUX_WL0 connects the unselected word line path among the plurality of word line paths as P_WL_unsel to the unselected WL voltage generation circuit GEN_WL_unsel.

The word line paths P_WL_sel and P_WL_unsel are wiring paths connected between the multiplexers MUX_WL1_1 to MUX_WLm_n and the multiplexer MUX_WL0. For example, 32 or 64 word line paths are provided. As described above, the multiplexer MUX_WL0 selects one of the plurality of word line paths and connects the selected word line path P_WL_sel to the selected WL voltage generation circuit GEN_WL_sel. The word line path P_WL_sel transmits the selected word line voltage VLOW. On the other hand, the multiplexer MUX_WL0 connects the unselected word line path P_WL_unsel among the plurality of word line paths to the unselected WL voltage generation circuit GEN_WL_unsel. The word line path P_WL_unsel transmits the unselected word line voltage VUX. The selected WL voltage generation circuit GEN_WL_sel functioning as a third power supply circuit generates the selected word line voltage VLOW to be applied to the selected word line WL_sel, from an external power supply. The selected word line voltage VLOW is a low-level voltage, and is, for example, a ground voltage (0 V). The word line path P_WL_sel transmits the selected word line voltage VLOW from the multiplexer MUX_WL0 to the multiplexers MUX_WL1_1 to MUX_WLm_n. The multiplexers MUX_WL1_1 to MUX_WLm_n and MUX_WL0 functioning as the second decoder electrically connect the selected word line WL_sel among the plurality of word lines WL to the selected WL voltage generation circuit GEN_WL_sel via the selected word line path P_WL_sel, and selectively apply the selected word line voltage VLOW to the selected word line WL_sel.

The unselected WL voltage generation circuit GEN_WL_unsel functioning as a fourth power supply circuit generates the unselected word line voltage VUX to be applied to the unselected word line WL_unsel, from an external power supply. The unselected word line voltage VUX is a voltage between the selected bit line voltage VREAD and the selected word line voltage VLOW, and is, for example, VREAD/2. The unselected word line voltage VUX is preferably substantially equal to the unselected bit line voltage VUB. However, the unselected word line voltage VUX may be different from the unselected bit line voltage VUB. The unselected word line path P_WL_unsel transmits the unselected word line voltage VUX from the multiplexer MUX_WL0 to the multiplexers MUX_WL1_1 to MUX_WLm_n. The multiplexers MUX_WL1_1 to MUX_WLm_n functioning as the second decoder electrically connect the unselected word line WL_unsel to the unselected WL voltage generation circuit GEN_WL_unsel via the unselected word line path P_WL_unsel, and selectively apply the unselected word line voltage VUX to the unselected word line WL_unsel.

As described above, a voltage difference between the selected bit line voltage VREAD and the selected word line voltage VLOW is applied to the selected memory cell MC_sel connected to the selected bit line BL_sel and the selected word line WL_sel. As a result, data is read from the selected memory cell MC_sel or data is written to the selected memory cell MC_sel.

The configurations of the bank BNK, the column decoder CD, and the row decoder RD are not limited thereto. For example, a connection aspect between each multiplexer and each memory cell array MCA is not limited thereto. Here, an example has been shown in which the number of layers of the bit lines BL is one (BL0), the number of layers of the word lines WL is one (WL0), and the number of layers of the memory cells is one. However, the number of layers of the bit lines BL, the number of layers of the word lines WL, and the number of layers of the memory cells are not limited thereto. For example, the total number of layers of the bit lines BL and the word lines WL may be five (BL0, WL0, BL1, WL1, BL2) and the number of layers of the memory cells may be four. In this case, the column decoder CD and the row decoder RD are configured to drive a plurality of bit lines BL and word lines WL, respectively.

Figure 3:
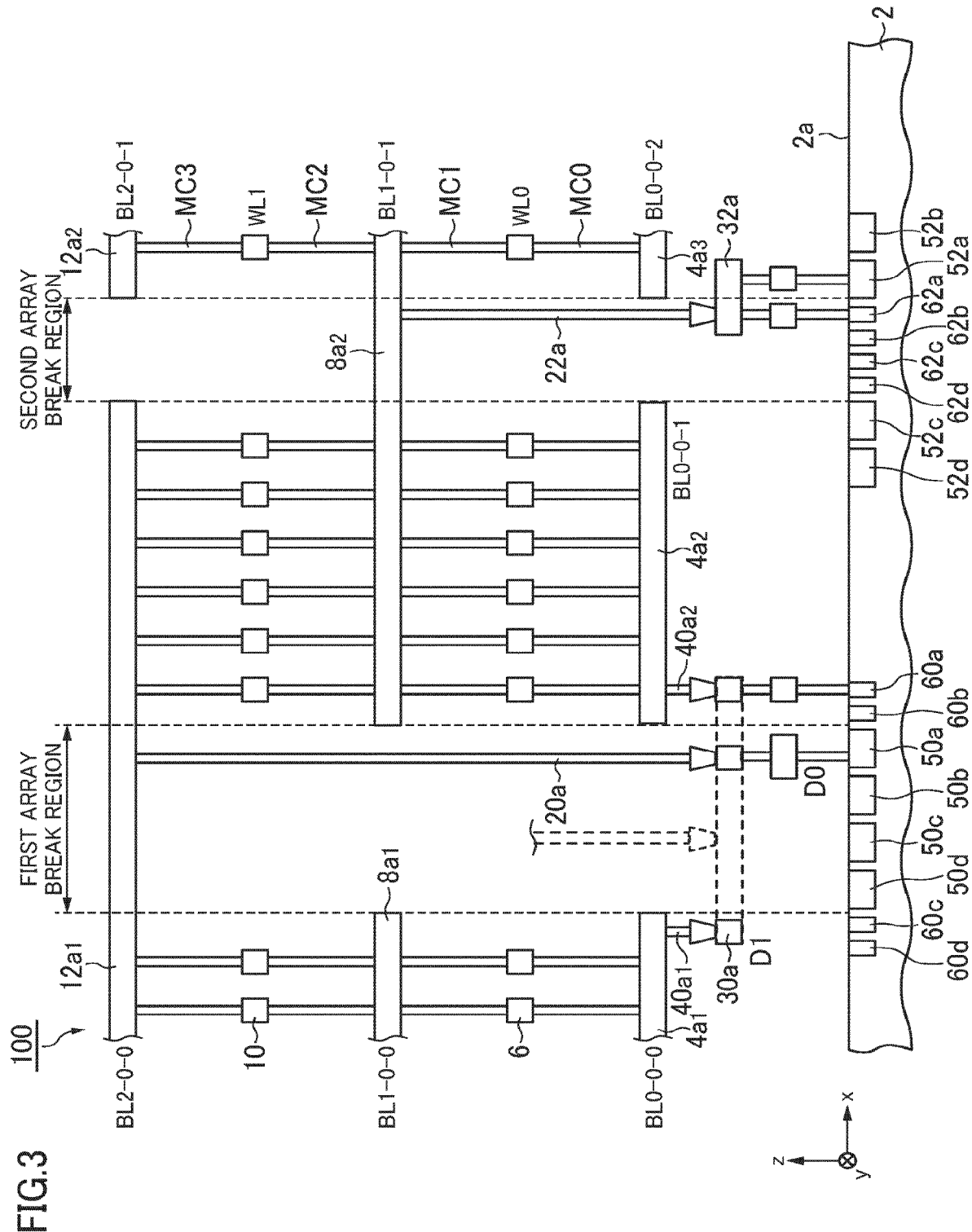
FIG. 3 is a schematic diagram showing a wiring structure of a semiconductor memory device according to the first embodiment.
Figure 4:
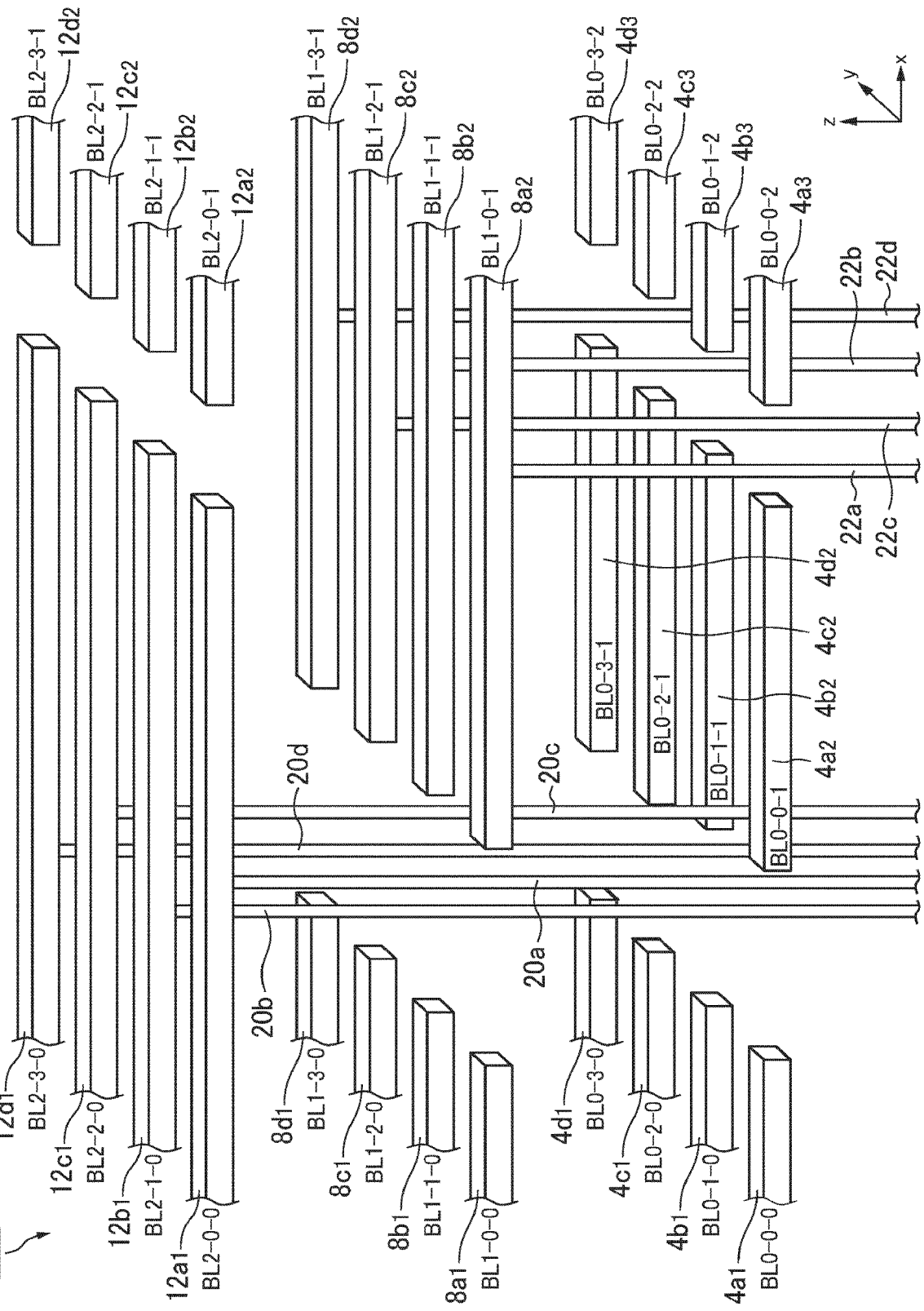
FIG. 4 is a schematic diagram showing a wiring structure of the semiconductor memory device according to the first embodiment.

FIG. 3 is a schematic diagram showing a wiring structure of a semiconductor memory device 100 according to the present embodiment. FIG. 4 is a schematic diagram showing a wiring structure of the semiconductor memory device 100 according to the present embodiment.

Here, an x axis, a y axis perpendicular to the x axis, and a z axis perpendicular to the x axis and the y axis are defined. An x direction parallel to the x axis is an example of a first direction, a y direction parallel to the y axis is an example of a second direction, and a z direction parallel to the z axis is an example of a third direction.

In FIG. 3, illustration of a part of BL0, parts of WL0 and BL1, parts of WL1 and BL2, a part of a via 20, a part of a via 22, and MC shown in FIG. 4 is omitted.

Further, in FIG. 4, illustration of a substrate 2, a first selected voltage generation circuit 50, a second selected voltage generation circuit 52, a first unselected voltage generation circuit 60, a second unselected voltage generation circuit 62, a connection conductor 30, a connection conductor 32, a connection conductor 34, and a via 40 shown in FIG. 3 is omitted.

For example, as shown in FIG. 3, in the semiconductor memory device 100 according to the present embodiment, a memory cell MC0 is provided on a bit line BL0, a word line WL1 is provided on the memory cell MC0, a memory cell MC1 is provided on the word line WL1, a bit line BL1 is provided on the memory cell MC1, a memory cell MC2 is provided on the bit line BL1, a word line WL2 is provided on the memory cell MC2, a memory cell MC3 is provided on the word line WL2, and a bit line BL2 is provided on the memory cell MC3. Here, for one of the bit line BL and the word line WL, even if driving is not performed (or a voltage is not applied) for each layer, that is, driving is performed for every odd layer or every even layer, it is possible to individually access (write or read) the memory cell MC in each layer. That is, by driving the bit line BL or the word line WL for every odd layer and every even layer, the column decoder CD or the row decoder RD can be configured with a smaller area, as compared with the case of performing driving for each layer. Therefore, in the semiconductor memory device 100 according to the present embodiment, among the bit lines BL0, BL1, and BL2, BL0 and BL2 are connected.

Here, the bit lines BL are generally formed thinly to improve a recording density of the semiconductor memory device 100. For this reason, it is difficult to directly connect the bit line BL2 to the bit line BL0 using a via. Therefore, a connection conductor 30a or the like is provided under the bit line BL0, and the bit line BL0 and the bit line BL2 are connected via the connection conductor 30a or the like.

Next, a specific configuration of the semiconductor memory device 100 will be described.

The semiconductor memory device 100 has the substrate 2. The substrate 2 is, for example, a semiconductor substrate such as an Si substrate, but is not limited thereto. The substrate 2 has a substrate plane 2a. The substrate plane 2a is assumed to be disposed in parallel to an xy plane.

The semiconductor memory device 100 includes a plurality of bit lines BL0. BL0 is provided above the substrate 2 in parallel to the x direction. Further, the semiconductor memory device 100 includes, as BL0, BL0-0-0 $4a_1$, BL0-0-1 $4a_2$, BL0-0-2 $4a_3$, BL0-1-0 $4b_1$, BL0-1-1 $4b_2$, BL0-1-2 $4b_3$, BL0-2-0 $4c_1$, BL0-2-1 $4c_2$, BL0-2-2 $4c_3$, BL0-3-0 $4d_1$, BL0-3-1 $4d_2$, and BL0-3-2 $4d_3$.

BL0-0-2 $4a_3$ (an example of a second wiring) is provided to be separated from BL0-0-0 $4a_1$ (an example of a first wiring) in the x direction. BL0-0-1 $4a_2$ (an example of a third wiring) is provided to be separated from BL0-0-0 $4a_1$ and BL0-0-2 $4a_3$ between BL0-0-0 $4a_1$ and BL0-0-2 $4a_3$. BL0-0-0 $4a_1$, BL0-0-1 $4a_2$, and BL0-0-2 $4a_3$ may be formed by cutting one BL0 at two locations. A method of forming BL0-0-0 $4a_1$, BL0-0-1 $4a_2$, and BL0-0-2 $4a_3$ is not limited thereto.

BL0-1-0 $4b_1$ (an example of an eighteenth wiring) is provided to be separated from BL0-0-0 $4a_1$ in the y direction. BL0-1-2 $4b_3$ is provided to be separated from BL0-1-0 $4b_1$ in the x direction. BL0-1-1 $4b_2$ (an example of a twenty-first wiring) is provided to be separated from BL0-1-0 $4b_1$ and BL0-1-2 $4b_3$ between BL0-1-0 $4b_1$ and BL0-1-2 $4b_3$. BL0-1-0 $4b_1$, BL0-1-1 $4b_2$, and BL0-1-2 $4b_3$ may be formed by cutting one BL0 at two locations. A method of forming BL0-1-0 $4b_1$, BL0-1-1 $4b_2$, and BL0-1-2 $4b_3$ is not limited thereto.

BL0-2-0 $4c_1$ (an example of a nineteenth wiring) is provided to be separated from BL0-1-0 $4b_1$ in the y direction. BL0-2-2 $4c_3$ is provided to be separated from BL0-2-0 $4c_1$ in the x direction. BL0-2-1 $4c_2$ (an example of a twenty-second wiring) is provided to be separated from BL0-2-0 $4c_1$ and BL0-2-2 $4c_3$ between BL0-2-0 $4c_1$ and BL0-2-2 $4c_3$. BL0-2-0 $4c_1$, BL0-2-1 $4c_2$, and BL0-2-2 $4c_3$ may be formed by cutting one BL0 at two locations. A method of forming BL0-2-0 $4c_1$, BL0-2-1 $4c_2$, and BL0-2-2 $4c_3$ is not limited thereto.

BL0-3-0 $4d_1$ (an example of a twentieth wiring) is provided to be separated from BL0-2-0 $4c_1$ in the y direction. BL0-3-2 $4d_3$ is provided to be separated from BL0-3-0 $4d_1$ in the x direction. BL0-3-1 $4d_2$ (an example of a twenty-third wiring) is provided to be separated from BL0-3-0 $4d_1$ and BL0-3-2 $4d_3$ between BL0-3-0 $4d_1$ and BL0-3-2 $4d_3$. BL0-3-0 $4d_1$, BL0-3-1 $4d_2$, and BL0-3-2 $4d_3$ may be formed by cutting one BL0 at two locations. A method of forming BL0-3-0 $4d_1$, BL0-3-1 $4d_2$, and BL0-3-2 $4d_3$ is not limited thereto.

An end of BL0-0-0 $4a_1$ facing BL0-0-1 $4a_2$, an end of BL0-1-0 $4b_1$ facing BL0-1-1 $4b_2$, an end of BL0-2-0 $4c_1$ facing BL0-2-1 $4c_2$, and an end of BL0-3-0 $4d_1$ facing BL0-3-1 $4d_2$ are arranged along the y direction. Further, an end of BL0-0-1 $4a_2$ facing BL0-0-0 $4a_1$, an end of BL0-1-1 $4b_2$ facing BL0-1-0 $4b_1$, an end of BL0-2-1 $4c_2$ facing BL0-2-0 $4c_1$, and an end of BL0-3-1 $4d_2$ facing BL0-3-0 $4d_1$ are arranged along the y direction.

An end of BL0-0-1 $4a_2$ facing BL0-0-2 $4a_3$, an end of BL0-1-1 $4b_2$ facing BL0-1-2 $4b_3$, an end of BL0-2-1 $4c_2$ facing BL0-2-2 $4c_3$, and an end of BL0-3-1 $4d_2$ facing BL0-3-2 $4d_3$ are arranged along the y direction. Further, an end of BL0-0-2 $4a_3$ facing BL0-0-1 $4a_2$, an end of BL0-1-2 $4b_3$ facing BL0-1-1 $4b_2$, an end of BL0-2-2 $4c_3$ facing BL0-2-1 $4c_2$, and an end of BL0-3-2 $4d_3$ facing BL0-3-1 $4d_2$ are arranged along the y direction.

Further, the semiconductor memory device 100 includes a plurality of bit lines BL1. BL1 is provided in parallel to the x direction, above BL0. Further, the semiconductor memory device 100 includes, as BL1, BL1-0-0 $8a_1$, BL1-0-1 $8a_2$, BL1-1-0 $8b_1$, BL1-1-1 $8b_2$, BL1-2-0 $8c_1$, BL1-2-1 $8c_2$, BL1-3-0 $8d_1$, and BL1-3-1 $8d_2$.

BL1-0-0 $8a_1$ (an example of a fourth wiring) is provided in parallel to the x direction, above BL0-0-0 $4a_1$. BL1-0-1 $8a_2$ (an example of a fifth wiring) is provided to be separated from BL1-0-0 $8a_1$ in the x direction and parallel to the x direction, over BL0-0-1 $4a_2$ and BL0-0-2 $4a_3$.

BL1-1-0 $8b_1$ (an example of a ninth wiring) is provided to be separated from BL1-0-0 $8a_1$ in the y direction, above BL0-1-0 $4b_1$. BL1-1-1 $8b_2$ (an example of a twelfth wiring) is provided to be separated from BL1-1-0 $8b_1$ in the x direction and to be separated from BL1-0-1 $8a_2$ in the y direction, above BL0-1-1 $4b_2$ and BL0-1-2 $4b_3$.

BL1-2-0 $8c_1$ (an example of a tenth wiring) is provided to be separated from BL1-1-0 $8b_1$ in the y direction, above BL0-2-0 $4c_1$. Further, BL1-1-0 $8b_1$ is provided between BL1-0-0 $8a_1$ and BL1-2-0 $8c_1$. BL1-2-1 $8c_2$ (an example of a thirteenth wiring) is provided to be separated from BL1-2-0 $8c_1$ in the x direction and to be separated from BL1-1-1 $8b_2$ in the y direction, above BL0-2-1 $4c_2$ and BL0-2-2 $4c_3$. Further, BL1-1-1 $8b_2$ is provided between BL1-0-1 $8a_2$ and BL1-2-1 $8c_2$.

BL1-3-0 $8d_1$ (an example of an eleventh wiring) is provided to be separated from BL1-2-0 $8c_1$ in the y direction, above BL0-3-0 $4d_1$. Further, BL1-2-0 $8c_1$ is provided between BL1-1-0 $8b_1$ and BL1-3-0 $8d_1$. BL1-3-1 $8d_2$ (an example of a fourteenth wiring) is provided to be separated from BL1-3-0 $8d_1$ in the x direction and to be separated from BL1-2-1 $8c_2$ in the y direction, above BL0-3-1 $4d_2$ and BL0-3-2 $4d_3$. Further, BL1-2-1 $8c_2$ is provided between BL1-1-1 $8b_2$ and BL1-3-1 $8d_2$.

For example, an end of BL1-0-0 $8a_1$ facing BL1-0-1 $8a_2$, an end of BL1-1-0 $8b_1$ facing BL1-1-1 $8b_2$, an end of BL1-2-0 $8c_1$ facing BL1-2-1 $8c_2$, and an end of BL1-3-0 $8d_1$ facing BL1-3-1 $8d_2$ are arranged along the y direction. Further, for example, an end of BL1-0-1 $8a_2$ facing BL1-0-0 $8a_1$, an end of BL1-1-1 $8b_2$ facing BL1-1-0 $8b_1$, an end of BL1-2-1 $8c_2$ facing BL1-2-0 $8c_1$, and an end of BL1-3-1 $8d_2$ facing BL1-3-0 $8d_1$ are arranged along the y direction.

For example, an end of BL0-0-0 $4a_1$ is disposed under an end of BL1-0-0 $8a_1$. For example, an end of BL0-1-0 $4b_1$ is disposed under an end of BL1-1-0 $8b_1$. For example, an end of BL0-2-0 $4c_1$ is disposed under an end of BL1-2-0 $8c_1$. For example, an end of BL0-3-0 $4d_1$ is disposed under an end of BL1-3-0 $8d_1$.

For example, an end of BL0-0-1 $4a_2$ is disposed under an end of BL1-0-1 $8a_2$. For example, an end of BL0-1-1 $4b_2$ is disposed under an end of BL1-1-1 $8b_2$. For example, an end of BL0-2-1 $4c_2$ is disposed under an end of BL1-2-1 $8c_2$. For example, an end of BL0-3-1 $4d_2$ is disposed under an end of BL1-3-1 $8d_2$.

Further, the semiconductor memory device 100 includes a plurality of bit lines BL2. BL2 is provided in parallel to the x direction, above BL1. Further, the semiconductor memory device 100 includes, as BL2, BL2-0-0 $12a_1$, BL2-0-1 $12a_2$, BL2-1-0 $12b_1$, BL2-1-1 $12b_2$, BL2-2-0 $12c_1$, BL2-2-1 $12c_2$, BL2-3-0 $12d_1$, and BL2-3-1 $12d_2$.

BL2-0-0 $12a_1$ (an example of a sixth wiring) is provided in parallel to the x direction, over BL1-0-0 $8a_1$ and BL1-0-1 $8a_1$. BL2-1-0 $12b_1$ (an example of a fifteenth wiring) is provided in parallel to the x direction, over BL1-1-0 $8b_1$ and BL1-1-1 $8b_2$. BL2-2-0 $12c_1$ (an example of a sixteenth wiring) is provided in parallel to the x direction, over BL1-2-0 $8c_1$ and BL1-2-1 $8c_2$. BL2-3-0 $12d_1$ (an example of a seventeenth wiring) is provided in parallel to the x direction, over BL1-3-0 $8d_1$ and BL1-3-1 $8d_2$.

BL2-0-1 $12a_2$ is provided to be separated from BL2-0-0 $12a_1$ in the x direction, above BL0-0-2 $4a_3$ and BL1-0-1 $8a_2$. BL2-1-1 $12b_2$ is provided to be separated from BL2-1-0 $12b_1$ in the x direction, above BL0-1-2 $4b_3$ and BL1-1-1 $8b_2$. BL2-2-1 $12c_2$ is provided to be separated from BL2-2-0 $12c_1$ in the x direction, above BL0-2-2 $4c_3$ and BL1-2-1 $8c_2$. BL2-3-1 $12d_2$ is provided to be separated from BL2-3-0 $12d_1$ in the x direction, above BL0-3-2 $4d_3$ and BL1-3-1 $8d_2$.

An end of BL2-0-0 $12a_1$ facing BL2-0-1 $12a_2$, an end of BL2-1-0 $12b_1$ facing BL2-1-1 $12b_2$, an end of BL2-2-0 $12c_1$ facing BL2-2-1 $12c_2$, and an end of BL2-3-0 $12d_1$ facing BL2-3-1 $12d_2$ are arranged along the y direction, for example. Further, an end of BL2-0-1 $12a_2$ facing BL2-0-0 $12a_1$, an end of BL2-1-1 $12b_2$ facing BL2-1-0 $12b_1$, an end of BL2-2-1 $12c_2$ facing BL2-2-0 $12c_1$, and an end of BL2-3-1 $12d_2$ facing BL2-3-0 $12d_1$ are arranged along the y direction, for example.

Further, for example, an end of BL2-0-0 $12a_1$ facing BL2-0-1 $12a_2$ is disposed above an end of BL0-0-1 $4a_2$ facing BL0-0-2 $4a_3$. For example, an end of BL2-1-0 $12b_1$ facing BL2-1-1 $12b_2$ is disposed above an end of BL0-1-1 $4b_2$ facing BL0-1-2 $4b_3$. For example, an end of BL2-2-0 $12c_1$ facing BL2-2-1 $12c_2$ is disposed above an end of BL0-2-1 $4c_2$ facing BL0-2-2 $4c_3$. For example, an end of BL2-3-0 $12d_1$ facing BL2-3-1 $12d_2$ is disposed above an end of BL0-3-1 $4d_2$ facing BL0-3-2 $4d_3$.

Further, for example, an end of BL2-0-1 $12a_2$ facing BL2-0-0 $12a_1$ is disposed immediately above an end of BL0-0-2 $4a_3$ facing BL0-0-1 $4a_2$. For example, an end of BL2-1-1 $12b_2$ facing BL2-1-0 $12b_1$ is disposed immediately above an end of BL0-1-2 $4b_3$ facing BL0-1-1 $4b_2$. For example, an end of BL2-2-1 $12c_2$ facing BL2-2-0 $12c_1$ is disposed immediately above an end of BL0-2-2 $4c_3$ facing BL0-2-1 $4c_2$. For example, an end of BL2-3-1 $12d_2$ facing BL2-3-0 $12d_1$ is disposed immediately above an end of BL0-3-2 $4d_3$ facing BL0-3-1 $4d_2$.

A plurality of word lines WL0 6 (an example of a seventh wiring) are provided in parallel to the y direction, between BL0 and BL1.

A plurality of word lines WL1 10 (an example of an eighth wiring) are provided in parallel to the y direction, between BL1 and BL2.

For example, when there is no distinction between BL0-0-0 and BL0-0-1, a plurality of BL0 are collectively referred to as BL0. The same is applied to WL0, BL1, WL1, and BL2.

The memory cells MC are provided between each BL0 and each WL0, between each WL0 and each BL1, between each BL1 and each WL1, and between each WL1 and each BL2.

Selected voltage generation circuits 50a, 50b, 50c, and 50d (examples of the first selected voltage generation circuit) functioning as the selected voltage generation circuit 50 are provided in the substrate 2 under portions where BL1-0-0 $8a_1$, BL1-1-0 $8b_1$, BL1-2-0 $8c_1$, and BL1-3-0 $8d_1$ and BL1-0-1 $8a_2$, BL1-1-1 $8b_2$, BL1-2-1 $8c_2$, and BL1-3-1 $8d_2$ are separated. The selected voltage generation circuits 50a, 50b, 50c, and 50d are examples of the selected BL voltage generation circuit GEN_BL_sel, and are, for example, electric circuits using N-type MOSFETs. The arrangement order of the selected voltage generation circuits 50a, 50b, 50c, and 50d on the substrate 2 is not limited to the example shown in FIG. 3.

Unselected voltage generation circuits 60a, 60b, 60c, and 60d (examples of the first unselected voltage generation circuit) functioning as the unselected voltage generation circuit 60 are provided to be adjacent to the selected voltage generation circuit 50, in the substrate 2 under BL1-0-0 $8a_1$, BL1-1-0 $8b_1$, BL1-2-0 $8c_1$, and BL1-3-0 $8d_1$ or the substrate 2 under BL1-0-1 $8a_2$, BL1-1-1 $8b_2$, BL1-2-1 $8c_2$, and BL1-3-1 $8d_2$. The unselected voltage generation circuits 60a, 60b, 60c, and 60d are examples of the unselected BL voltage generation circuit GEN_BL_unsel, and are, for example, electric circuits using P-type MOSFETs. The arrangement order of the unselected voltage generation circuits 60a, 60b, 60c, and 60d on the substrate 2 is not limited to the example shown in FIG. 3.

Unselected voltage generation circuits 62a, 62b, 62c, and 62d (examples of the second unselected voltage generation circuit) functioning as the unselected voltage generation circuit 62 are provided in the substrate 2 under portions where BL0-0-1 $4a_2$, BL0-1-1 $4b_2$, BL0-2-1 $4c_2$, and BL0-3-1 $4d_2$ and BL0-0-2 $4a_3$, BL0-1-2 $4b_3$, BL0-2-2 $4c_3$, and BL0-3-2 $4d_3$ are separated. The unselected voltage generation circuits 62a, 62b, 62c, and 62d are examples of the unselected BL voltage generation circuit GEN_BL_unsel, and are, for example, electric circuits using P-type MOSFETs. The arrangement order of the unselected voltage generation circuits 62a, 62b, 62c, and 62d on the substrate 2 is not limited to the example shown in FIG. 3.

Selected voltage generation circuits 52a, 52b, 52c, and 52d (examples of the second selected voltage generation circuit) functioning as the selected voltage generation circuit 52 are provided to be adjacent to the unselected voltage generation circuit 62, in the substrate 2 under BL0-0-1 $4a_2$, BL0-1-1 $4b_2$, BL0-2-1 $4c_2$, and BL0-3-1 $4d_2$ or in the substrate 2 under BL0-0-2 $4a_3$, BL0-1-2 $4b_3$, BL0-2-2 $4c_3$, and BL0-3-2 $4d_3$. The selected voltage generation circuits 52a, 52b, 52c, and 52d are examples of the selected BL voltage generation circuit GEN_BL_sel, and are, for example, electric circuits using N-type MOSFETs. The arrangement order of the selected voltage generation circuits 52a, 52b, 52c, and 52d on the substrate 2 is not limited to the example shown in FIG. 3.

A region above a region of the substrate 2 where the selected voltage generation circuit 50 is disposed is referred to as a first array break region. In the present embodiment, BL1-0-0 $8a_1$ and BL1-0-1 $8a_2$, BL1-1-0 $8b_1$ and BL1-1-1 $8b_2$, BL1-2-0 $8c_1$ and BL1-2-1 $8c_2$, and BL1-3-0 $8d_1$ and BL1-3-1 $8d_2$ are not provided in the first array break region. BL1 can be considered to be cut at least in the first array break region. For example, BL1 may be provided in the first array break region depending on the size of the N-type MOSFET configuring the selected voltage generation circuits 50a, 50b, 50c, and 50d or the layout of the selected voltage generation circuit 50.

Further, a region above a region of the substrate 2 where the selected voltage generation circuit 62 is disposed is referred to as a second array break region. In the present embodiment, BL0-0-1 $4a_2$ and BL0-0-2 $4a_3$, BL0-1-1 $4b_2$ and BL0-1-2 $4b_3$, BL0-2-1 $4c_2$ and BL0-2-2 $4c_3$, and BL0-3-1 $4d_2$ and BL0-3-2 $4d_3$ are not provided in the second array break region. BL0 can be considered to be cut at least in the second array break region. For example, BL0 may be provided in the second array break region depending on the size of the P-type MOSFET configuring the unselected voltage generation circuits 62a, 62b, 62c, and 62d or the layout of the selected voltage generation circuit 62.

Likewise, in the present embodiment, BL2-0-0 $12a_1$ and BL2-0-1 $12a_2$, BL2-1-0 $12b_1$ and BL2-1-1 $12b_2$, BL2-2-0 $12c_1$ and BL2-2-1 $12c_2$, and BL2-3-0 $12d_1$ and BL2-3-1 $12d_2$ are not provided in the second array break region. BL2 can be considered to be cut at least in the second array break region.

One end of a via 20a (an example of a second connection wiring) is connected to BL2-0-0 $12a_1$. A part of the via 20a is provided in a portion where BL0-0-0 $4a_1$ and BL0-0-1 $4a_2$ are separated (between BL0-0-0 $4a_1$ and BL0-0-1 $4a_2$).

One end of a via 20b (an example of a ninth connection wiring) is connected to BL2-1-0 $12b_1$. A part of the via 20b is provided in a portion where BL0-1-0 $4b_1$ and BL0-1-1 $4b_2$ are separated (between BL0-1-0 $4b_1$ and BL0-1-1 $4b_2$).

One end of a via 20c (an example of a thirteenth connection wiring) is connected to BL2-2-0 $12c_1$. A part of the via 20c is provided in a portion where BL0-2-0 $4c_1$ and BL0-2-1 $4c_2$ are separated (between BL0-2-0 $4c_1$ and BL0-2-1 $4c_2$).

One end of a via 20d (an example of a seventeenth connection wiring) is connected to BL2-3-0 $12d_1$. A part of the via $20d$ is provided in a portion where BL0-3-0 $4d_1$ and BL0-3-1 $4d_2$ are separated (between BL0-3-0 $4d_1$ and BL0-3-1 $4d_2$).

Figure 5:
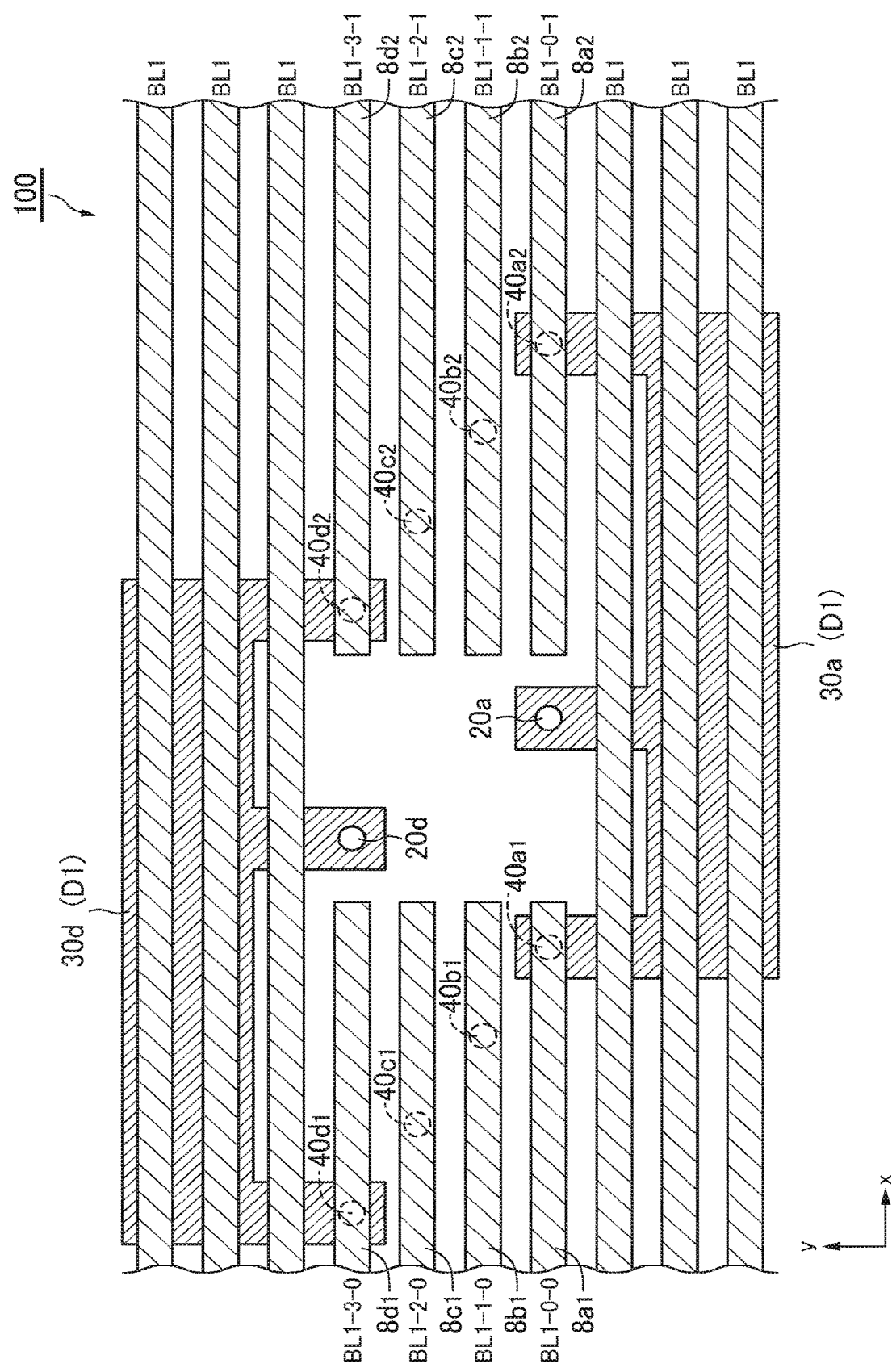
FIG. 5 is a schematic diagram showing a part of a wiring structure of the semiconductor memory device according to the first embodiment.
Figure 6:
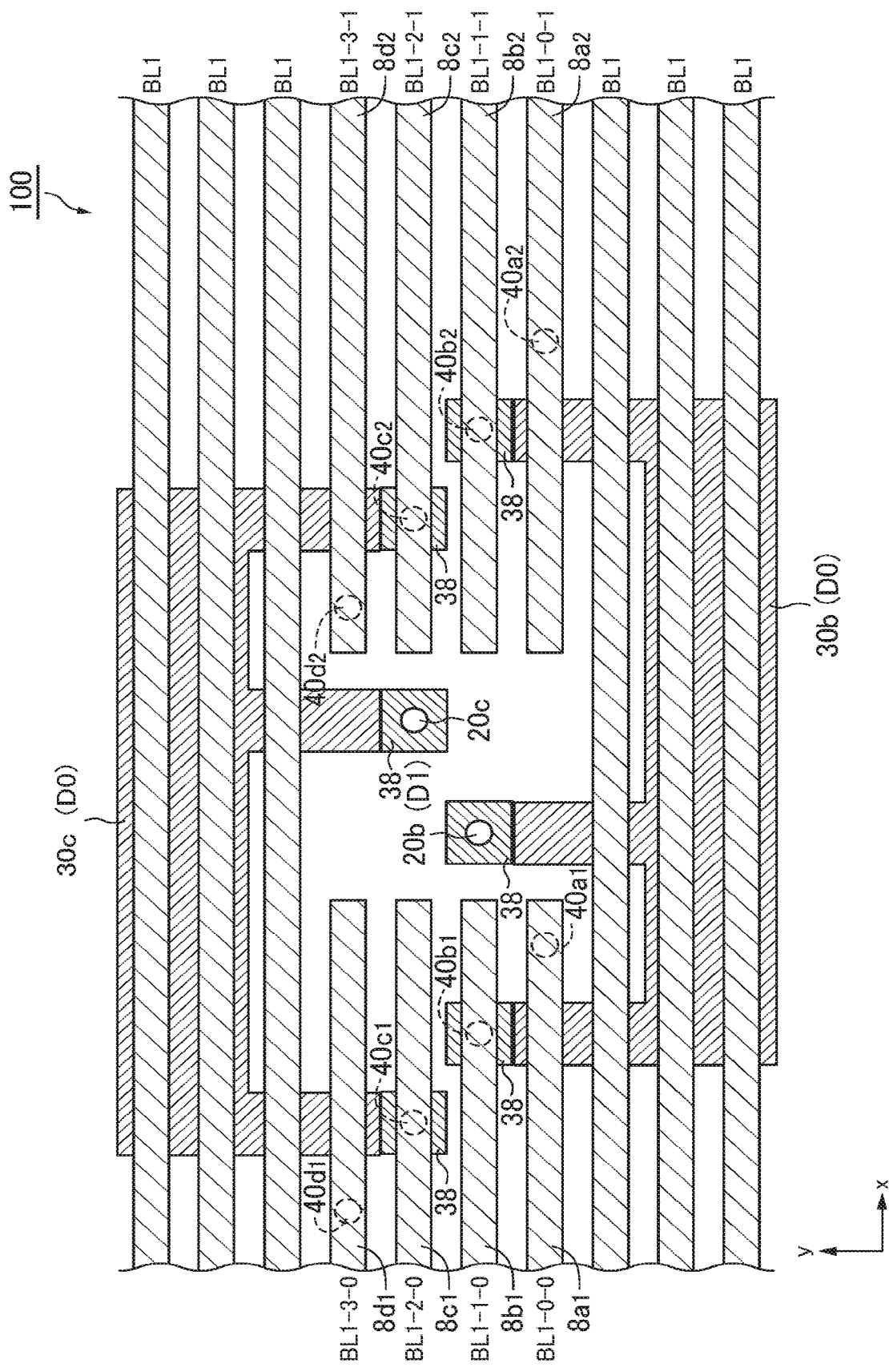
FIG. 6 is a schematic diagram showing a part of a wiring structure of the semiconductor memory device according to the first embodiment.

FIGS. 5 and 6 are schematic diagrams showing a part of a wiring structure of the semiconductor memory device 100 according to the present embodiment. FIGS. 5 and 6 are diagrams showing connection aspects of BL1, the via 20, and the via 40 of the semiconductor memory device 100 according to the present embodiment. In FIGS. 5 and 6, illustration of BL1, BL2, WL0 6, WL1 10, the memory cell MC, a part of the via 20, and a part of the via 40 is omitted.

Figure 7:
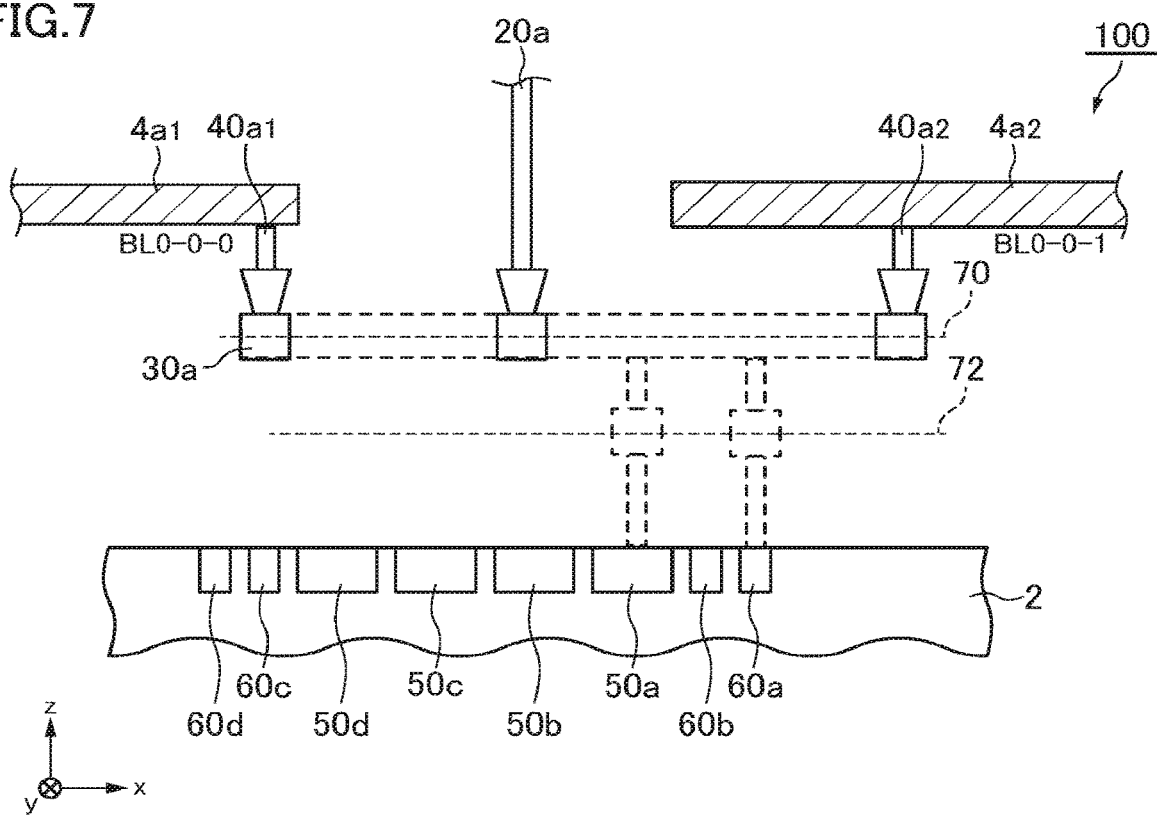
FIG. 7 is a schematic diagram showing a part of a wiring structure of the semiconductor memory device according to the first embodiment.
Figure 8:
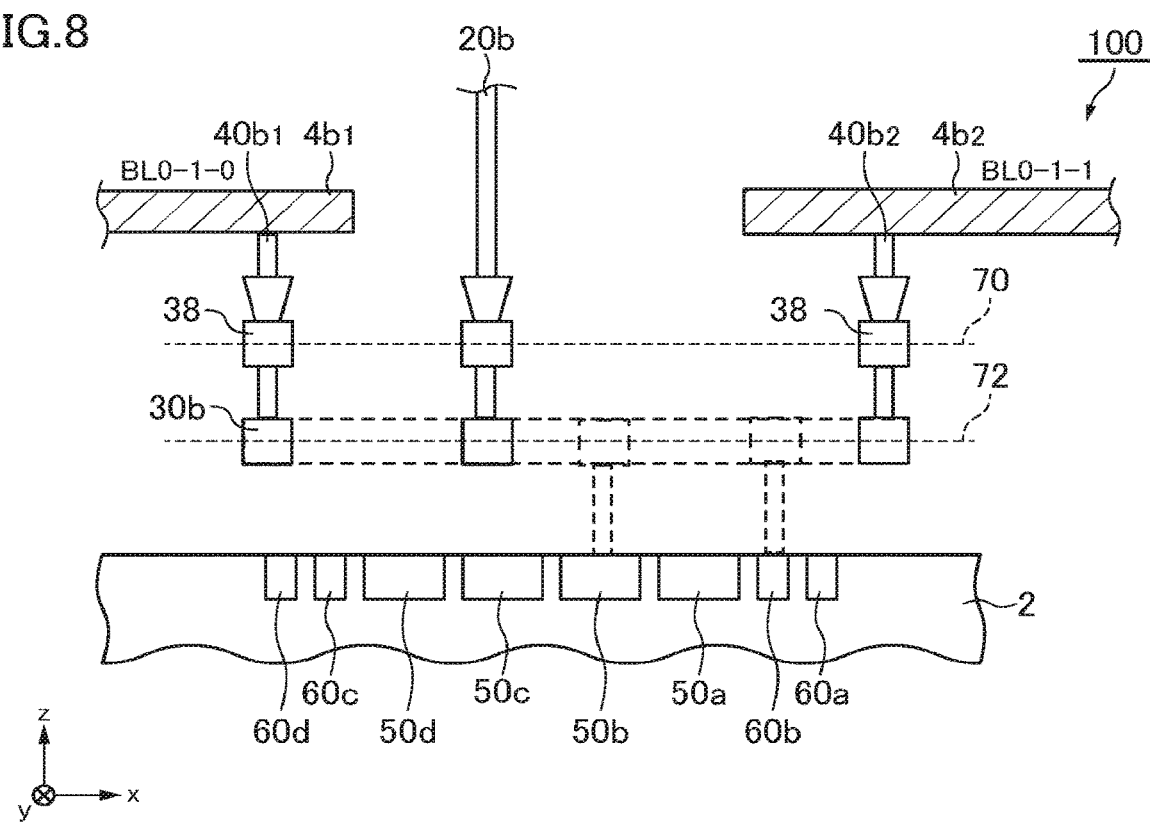
FIG. 8 is a schematic diagram showing a part of a wiring structure of the semiconductor memory device according to the first embodiment.
Figure 9:
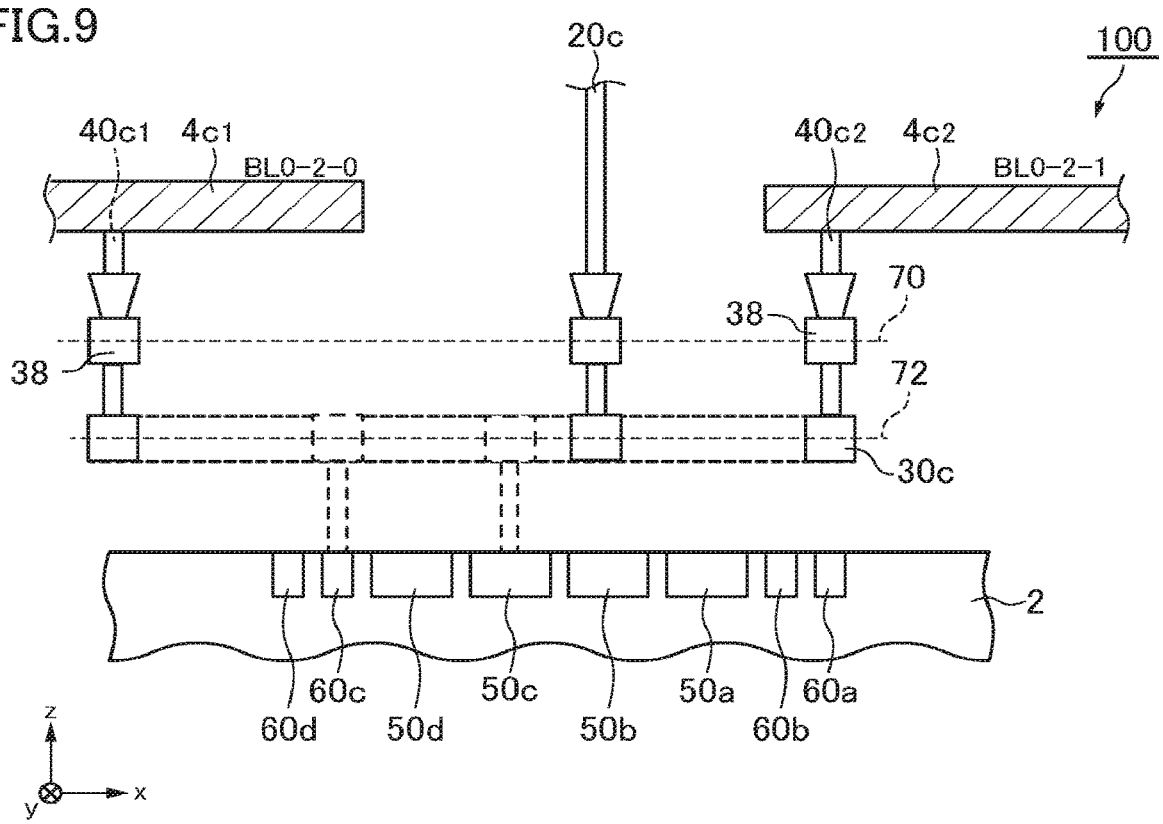
FIG. 9 is a schematic diagram showing a part of a wiring structure of the semiconductor memory device according to the first embodiment.
Figure 10:
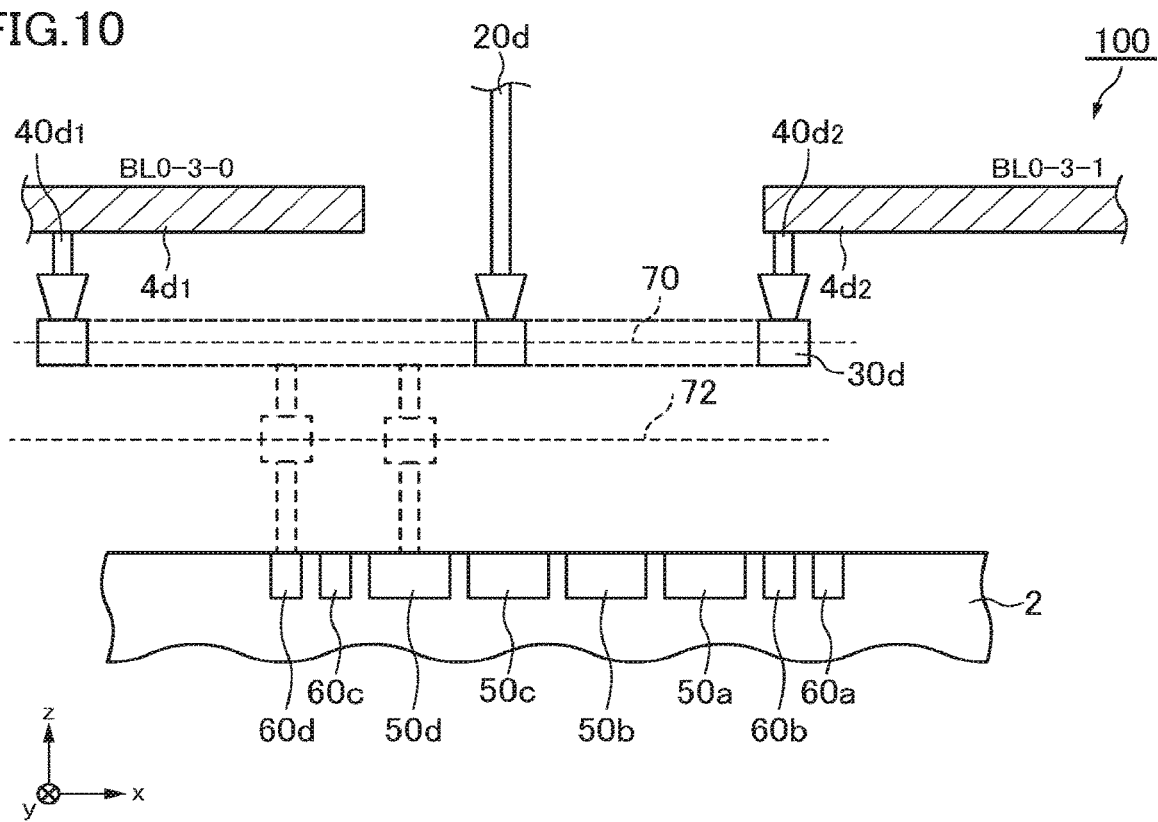
FIG. 10 is a schematic diagram showing a part of a wiring structure of the semiconductor memory device according to the first embodiment.

FIGS. 7, 8, 9, and 10 are schematic diagrams conceptually showing a part of a wiring structure of the semiconductor memory device 100 according to the present embodiment. FIG. 7 is a schematic diagram showing a connection aspect of a connection conductor 30a. FIG. 8 is a schematic diagram showing a connection aspect of a connection conductor 30b. FIG. 9 is a schematic diagram showing a connection aspect of a connection conductor 30c. FIG. 10 is a schematic diagram showing a connection aspect of a connection conductor 30d.

The connection conductor 30a (an example of a first connection wiring) is provided under a portion where BL0-0-0 $4a_1$ and BL0-0-1 $4a_2$ are separated, above the substrate 2. More specifically, the connection conductor 30a is provided in a virtual plane 70 parallel to the substrate plane 2a, between the substrate 2 and BL1. The virtual plane 70 is provided with a wiring layer D1 for forming wirings including connection conductors such as the connection conductor 30a.

The other end of the via 20a is connected to the connection conductor 30a. A via $40a_1$ (an example of a third connection wiring) connects BL0-0-0 $4a_1$ and the connection conductor 30a. A via $40a_2$ (an example of a fourth connection wiring) connects BL0-0-1 $4a_2$ and the connection conductor 30a. In other words, BL2-0-0 $12a_1$, BL0-0-0 $4a_1$, and BL0-0-1 $4a_2$ are connected via the connection conductor 30a, the via 20a, the via $40a_1$, and the via $40a_2$.

The connection conductor 30b (an example of an eighth connection wiring) is provided under a portion where BL0-1-0 $4b_1$ and BL0-1-1 $4b_2$ are separated, above the substrate 2. More specifically, the connection conductor 30b is provided in a virtual plane 72 provided below the virtual plane 70 and provided parallel to the substrate plane 2a, between the substrate 2 and BL1. The virtual plane 72 is provided with a wiring layer D0 for forming wirings including connection conductors such as the connection conductor 30b. The wiring layer D0 is provided on the substrate 2, and the wiring layer D1 is provided on the wiring layer D0.

The other end of the via 20b is connected to a connection conductor 38 provided in the virtual plane 70, and is further connected to the connection conductor 30b via the connection conductor 38. A via $40b_1$ (an example of a tenth connection wiring) connects BL0-1-0 $4b_1$ and the connection conductor 30b via the connection conductor 38. A via $40b_2$ (an example of an eleventh connection wiring) connects BL0-1-1 $4b_2$ and the connection conductor 30b via the connection conductor 38. In other words, BL2-1-0 $12b_1$, BL0-1-0 $4b_1$, and BL0-1-1 $4b_2$ are connected via the connection conductor 30b, the connection conductor 38, the via 20b, the via $40b_1$, and the via $40b_2$.

The connection conductor 30c (an example of a twelfth connection wiring) is provided under a portion where BL1-2-0 $4c_1$ and BL1-2-1 $4c_2$ are separated, above the substrate 2. More specifically, the connection conductor 30c is provided in the virtual plane 72 to be provided below the virtual plane 70 and provided parallel to the substrate plane 2a, between the substrate 2 and BL1.

The other end of the via 20c is connected to a connection conductor 38 provided in the virtual plane 70, and is further connected to the connection conductor 30c via the connection conductor 38. A via $40c_1$ (an example of a fourteenth connection wiring) connects BL0-2-0 $4c_1$ and the connection conductor 30c via the connection conductor 38. A via $40c_2$ (an example of a fifteenth connection wiring) connects BL0-2-1 $4c_2$ and the connection conductor 30c via the connection conductor 38. In other words, BL2-2-0 $12c_1$, BL0-2-0 $4c_1$, and BL0-2-1 $4c_2$ are connected via the connection conductor 30c, the connection conductor 38, the via 20c, the via $40c_1$, and the via $40c_2$.

The connection conductor 30d (an example of a sixteenth connection wiring) is provided under a portion where BL1-3-0 $4d_1$ and BL1-3-1 $4d_2$ are separated, above the substrate 2. More specifically, the connection conductor 30d is provided in the virtual plane 70 parallel to the substrate plane 2a, between the substrate 2 and BL1.

The other end of the via 20d is connected to the connection conductor 30d. A via $40d_1$ (an example of an eighteenth connection wiring) connects BL0-3-0 $4d_1$ and the connection conductor 30d. A via $40d_2$ (an example of a nineteenth connection wiring) connects BL0-3-1 $4d_2$ and the connection conductor 30d. In other words, BL2-3-0 $12d_1$, BL0-3-0 $4d_1$, and BL0-3-1 $4d_2$ are connected via the connection conductor 30d, the via 20d, the via $40d_1$, and the via $40d_2$.

The connection conductors 30a, 30b, 30c, and 30d have shapes of an alphabet E in the virtual plane 70 or the virtual plane 72. However, the shapes of the connection conductors 30a, 30b, 30c, and 30d are not limited thereto.

The connection conductor 30a also connects the unselected voltage generation circuit 60a with BL0-0-1 $4a_2$ and with BL0-0-0 $4a_1$.

The connection conductor 30b also connects the unselected voltage generation circuit 60b with BL0-1-1 $4b_2$ and with BL0-1-0 $4b_1$.

The connection conductor 30c also connects the unselected voltage generation circuit 60c with BL0-2-0 $4c_1$ and with BL0-2-1 $4c_2$.

The connection conductor 30d connects the unselected voltage generation circuit 60d with BL0-3-0 $4d$, and with BL0-3-1 $4d_2$.

Figure 11:
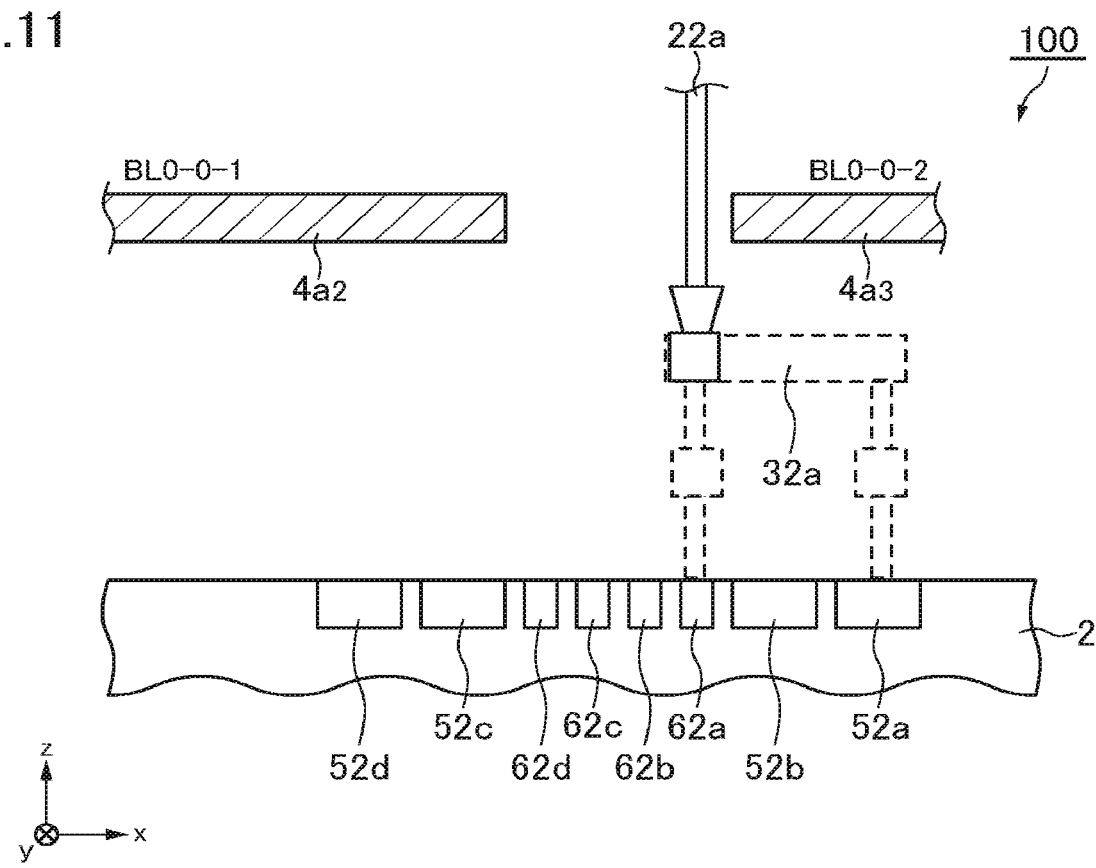
FIG. 11 is a schematic diagram showing a part of a wiring structure of the semiconductor memory device according to the first embodiment.
Figure 12:
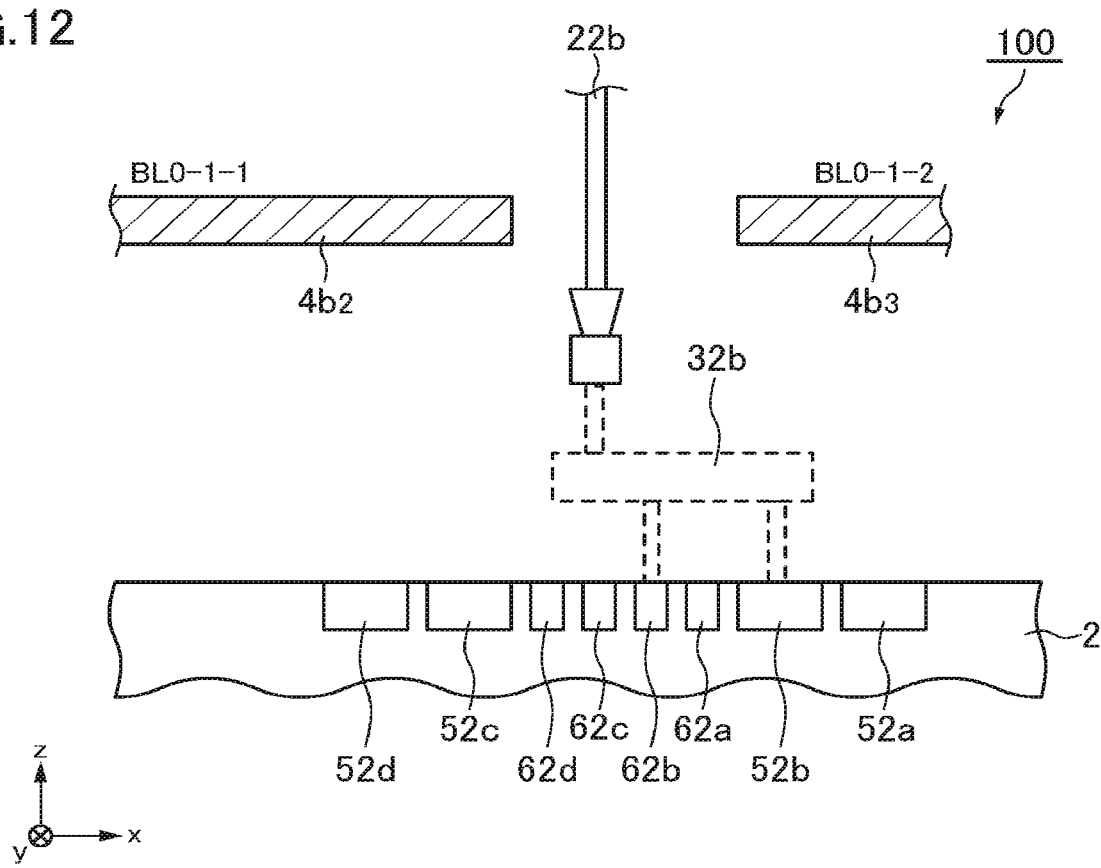
FIG. 12 is a schematic diagram showing a part of a wiring structure of the semiconductor memory device according to the first embodiment.
Figure 13:
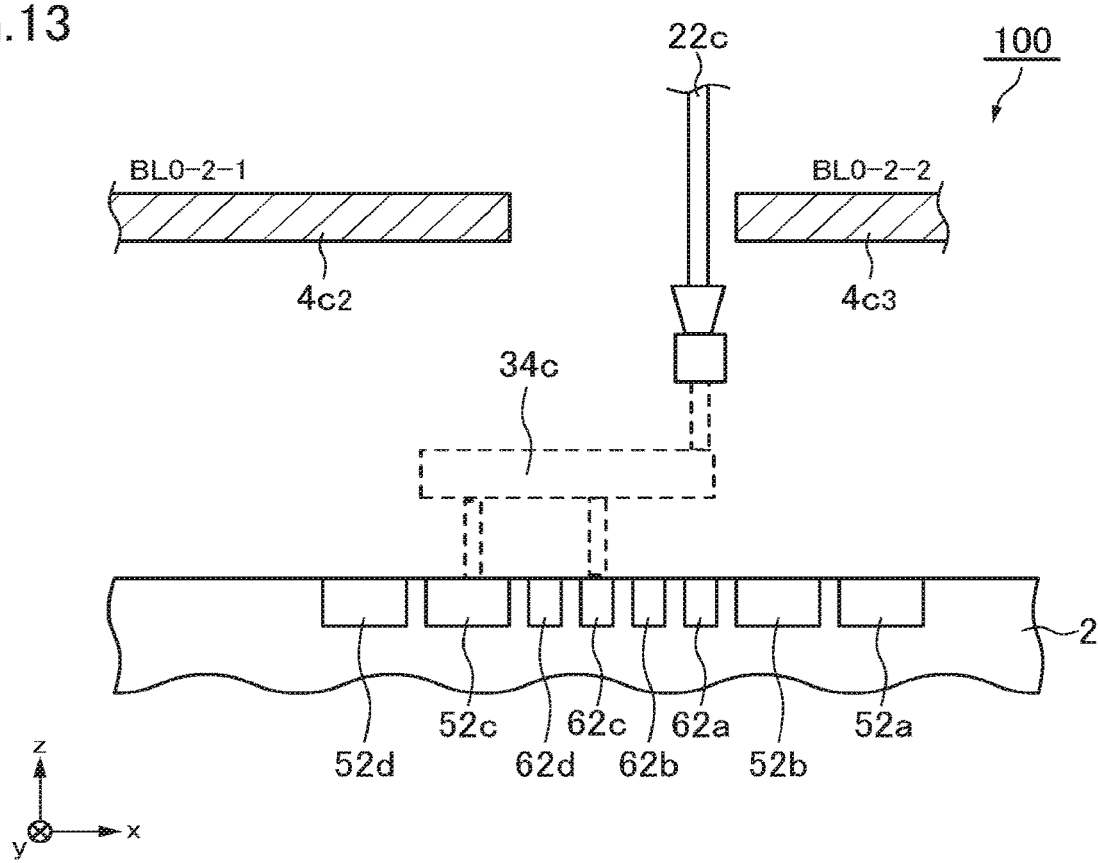
FIG. 13 is a schematic diagram showing a part of a wiring structure of the semiconductor memory device according to the first embodiment.
Figure 14:
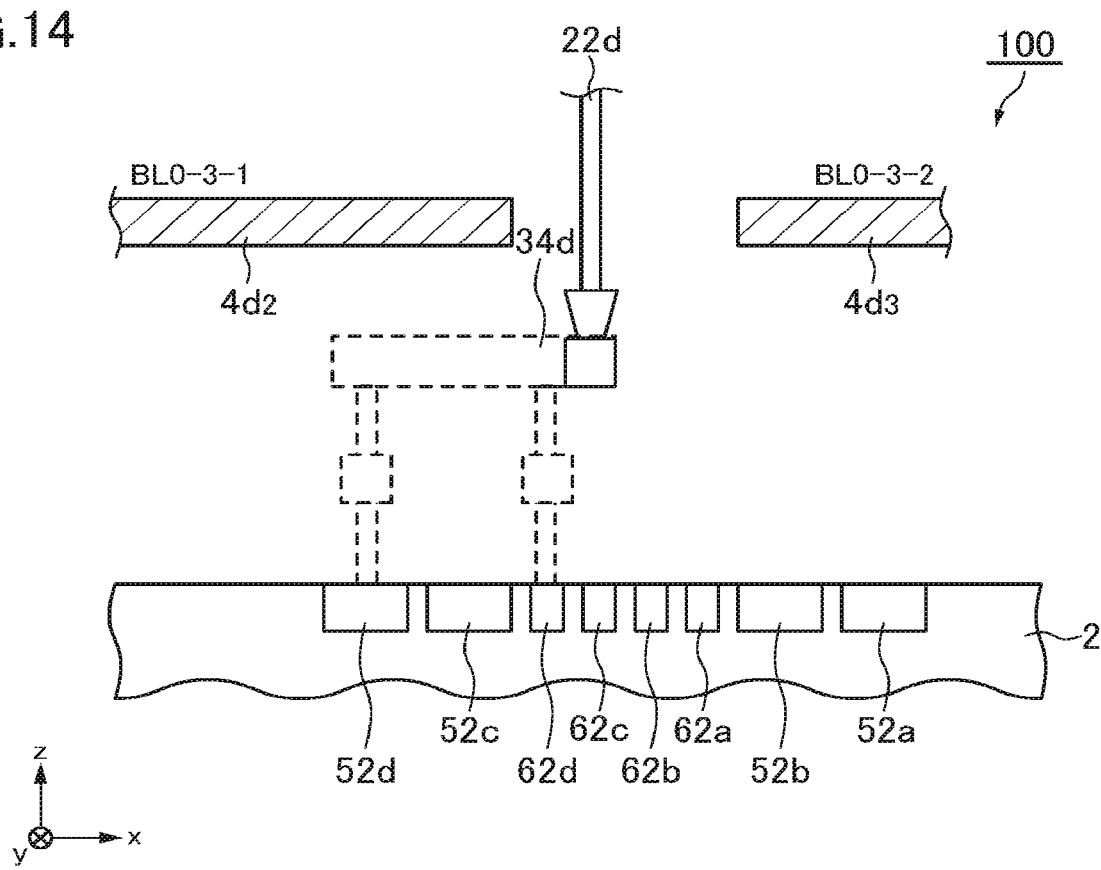
FIG. 14 is a schematic diagram showing a part of a wiring structure of the semiconductor memory device according to the first embodiment.

FIGS. 11, 12, 13, and 14 are schematic diagrams conceptually showing a part of a wiring structure of the semiconductor memory device 100 according to the present embodiment. FIG. 11 is a schematic diagram showing a connection aspect of a connection conductor 32a (an example of a fifth connection wiring). FIG. 12 is a schematic diagram showing a connection aspect of a connection conductor 32b. FIG. 13 is a schematic diagram showing a connection aspect of a connection conductor 34c. FIG. 14 is a schematic diagram showing a connection aspect of a connection conductor 34d.

The connection conductor 32a connects the selected voltage generation circuit 52a and the unselected voltage generation circuit 62a to the via 22a (an example of the sixth connection wiring). The connection conductor 32b connects the selected voltage generation circuit 52b and the unselected voltage generation circuit 62b to the via 22b. The connection conductor 34c connects the selected voltage generation circuit 52c and the unselected voltage generation circuit 62c to the via 22c. The connection conductor 34d connects the selected voltage generation circuit 52d and the unselected voltage generation circuit 62d to the via 22d.

In the semiconductor memory device 100 according to the present embodiment, an insulator not shown in the drawings is provided around each BL, WL, memory cell MC, and connection conductor.

Next, functions and effects of the semiconductor memory device 100 according to the present embodiment will be described.

As described above, preferably, the column decoder CD or the row decoder RD is configured with a smaller area, and the bit line BL or the word line WL is driven for every odd layer and every even layer in order to reduce the semiconductor memory device 100. For this purpose, for example, it is conceivable that the bit line BL2 and the bit line BL0 are directly connected by a via or the like.

However, the bit line BL and the word line WL are thin lines with small dimensions in order to increase the recording density. For example, each layer of the bit line BL and the word line WL is formed as a highly regular line-and-space pattern by using a sidewall machining process.

On the other hand, the wiring layer D1 provided in the virtual plane 70 and the wiring layer D0 provided in the virtual plane 72 are layers where wirings connected to the memory cell array are formed. Such a wiring structure is different depending on the structure of the memory cell array, the structure and arrangement of the drive circuit of the memory cell array, and the like. Therefore, for the wirings of the wiring layer D1 provided in the virtual plane 70 and the wiring layer D0 provided in the virtual plane 72, wiring shapes can be changed relatively freely. On the other hand, while the wiring shapes can be freely formed, it is difficult to reduce the wiring dimensions as the bit line BL and the word line WL, so that the wirings have large dimensions.

Therefore, in the semiconductor memory device 100 according to the present embodiment, the selected voltage generation circuit is disposed on the substrate 2 in the first array break region. A part of BL0 is separated like BL0-0-0 $4a_1$ and BL0-0-1 $4a_2$, for example. Further, the connection conductor 30a is provided under a portion where BL0-0-0 $4a_1$ and BL0-0-1 $4a_2$ are separated, above the substrate 2. BL2-0-0 $12a_1$ and the connection conductor 30a are connected using the via 20a. Further, BL0-0-0 $4a_1$ and BL0-0-1 $4a_2$ and the connection conductor 30a are connected using the via $40a_1$ and the via $40a_2$, respectively. On the other hand, the unselected voltage generation circuit is disposed in a region under BL0 adjacent to the selected voltage generation circuit, and is connected to BL0 using the connection conductor 34a.

That is, when the bit line BL2 and the bit line BL0 are connected, the bit line BL2 and the bit line BL0 can be connected using wiring with large dimensions in the case of connecting the bit line BL2 and the bit line BL0 using the connection conductors 30 or the like provided in the virtual plane 70 and the virtual plane 72 (the wiring layer D1 and the wiring layer D0) rather than the case of connecting the bit line BL2 and the bit line BL0 directly using the via. As a result, even if a via misalignment or the like occurs, the bit line BL2 and the bit line BL0 can be connected stably. Therefore, even with a simple wiring structure, a semiconductor memory device with high connection reliability can be provided.

Further, in the semiconductor memory device 100 of the present embodiment, the connection conductors are disposed in two types of virtual planes, that is, the virtual plane 70 and the virtual plane 72. By disposing the connection conductors using the two types of virtual planes, wirings can be easily formed. A method of disposing the connection conductors is not limited thereto.

Figure 15:
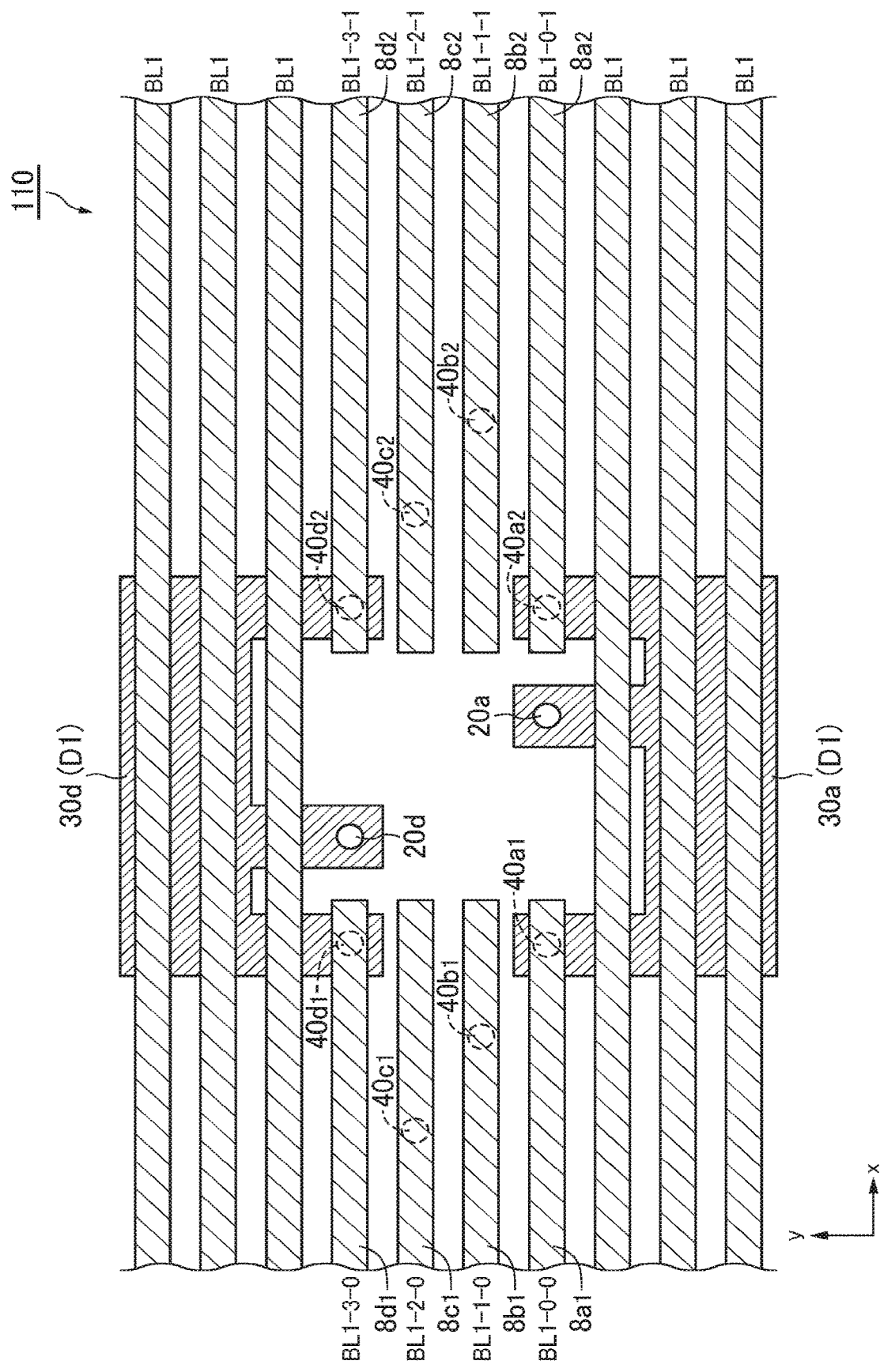
FIG. 15 is a schematic diagram showing a part of a wiring structure of a semiconductor memory device according to the first other aspect of the first embodiment.
Figure 16:
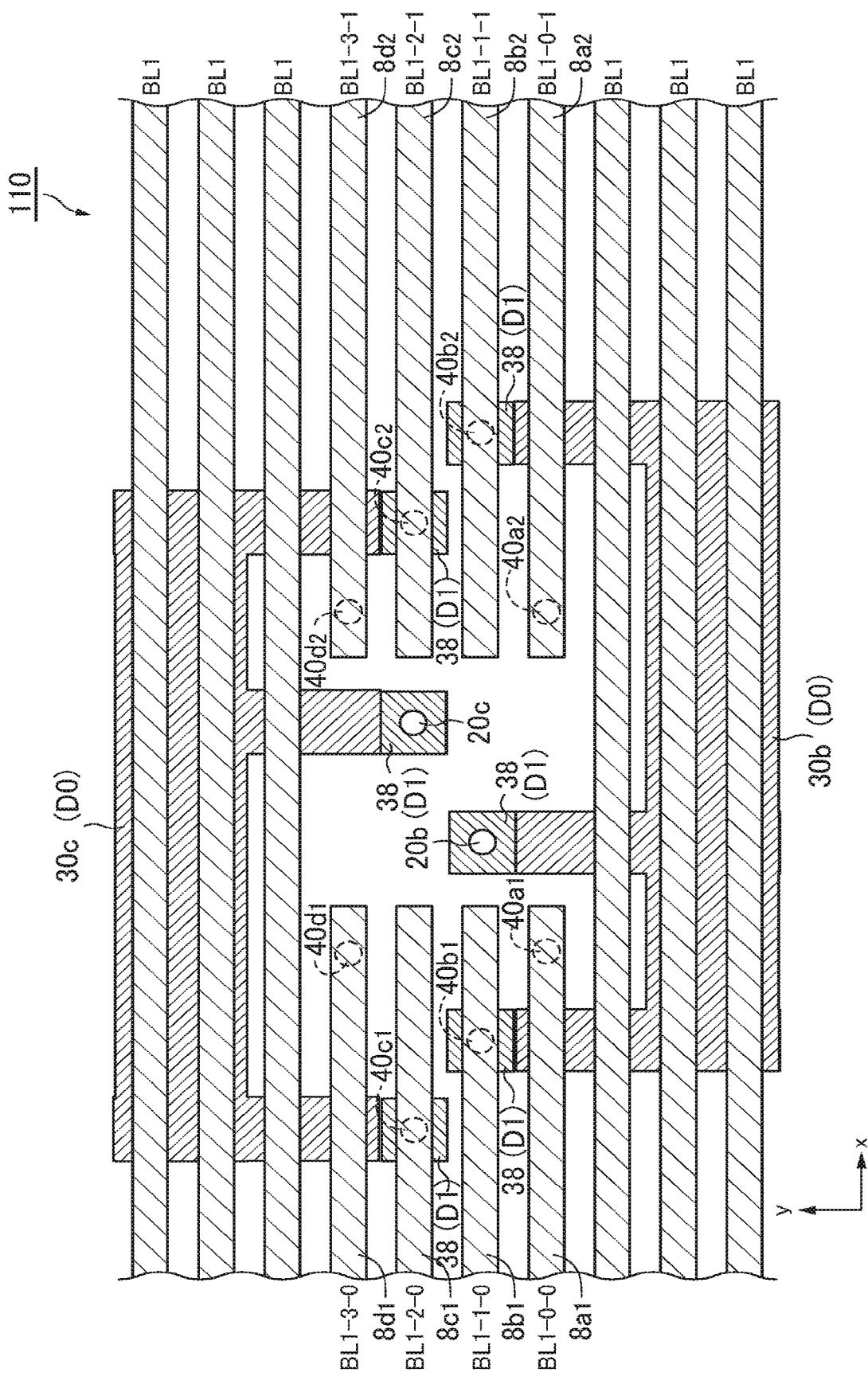
FIG. 16 is a schematic diagram showing a part of a wiring structure of the semiconductor memory device according to the first other aspect of the first embodiment.

FIGS. 15 and 16 are schematic diagrams showing a part of a wiring structure of a semiconductor memory device 110 according to the first other aspect of the present embodiment; The semiconductor memory device 110 is different from the semiconductor memory device 100 in that the via $40a_2$ is provided to be closer to the via 20a and the via $40d_1$ is provided to be closer to the via 20d. Accordingly, the shapes of the connection conductor 30a and the connection conductor 30d of the semiconductor memory device 110 are also different from those of the semiconductor memory device 100. That is, in the case of the semiconductor memory device 100, for example, as shown in FIGS. 5 and 6, in the x direction (an example of the first direction), the via $40b_1$ (an example of the tenth connection wiring) and the via $40c_1$ (an example of the fourteenth connection wiring) are provided between the via 20d (an example of the seventeenth connection wiring) and the via $40d_1$ (an example of the eighteenth connection wiring), and in the x direction (an example of the first direction), the via $40b_2$ (an example of the eleventh connection wiring) and the via $40c_2$ (an example of the fifteenth connection wiring) are provided between the via 20a (an example of the second connection wiring) and the via $40a_2$ (an example of the fourth connection wiring). Meanwhile, in the case of the semiconductor memory device 110, for example, as shown in FIGS. 15 and 16, in the x direction (an example of the first direction), the via $40d_1$ (an example of the eighteenth connection wiring) is provided between the via $40b_1$ (an example of the tenth connection wiring) and the via 20d (an example of the seventeenth connection wiring), and in the x direction (an example of the first direction), the via $40a_2$ (an example of the fourth connection wiring) is provided between the via 20a (an example of the second connection wiring) and the via $40c_2$ (an example of the fifteenth connection wiring).

Figure 17:
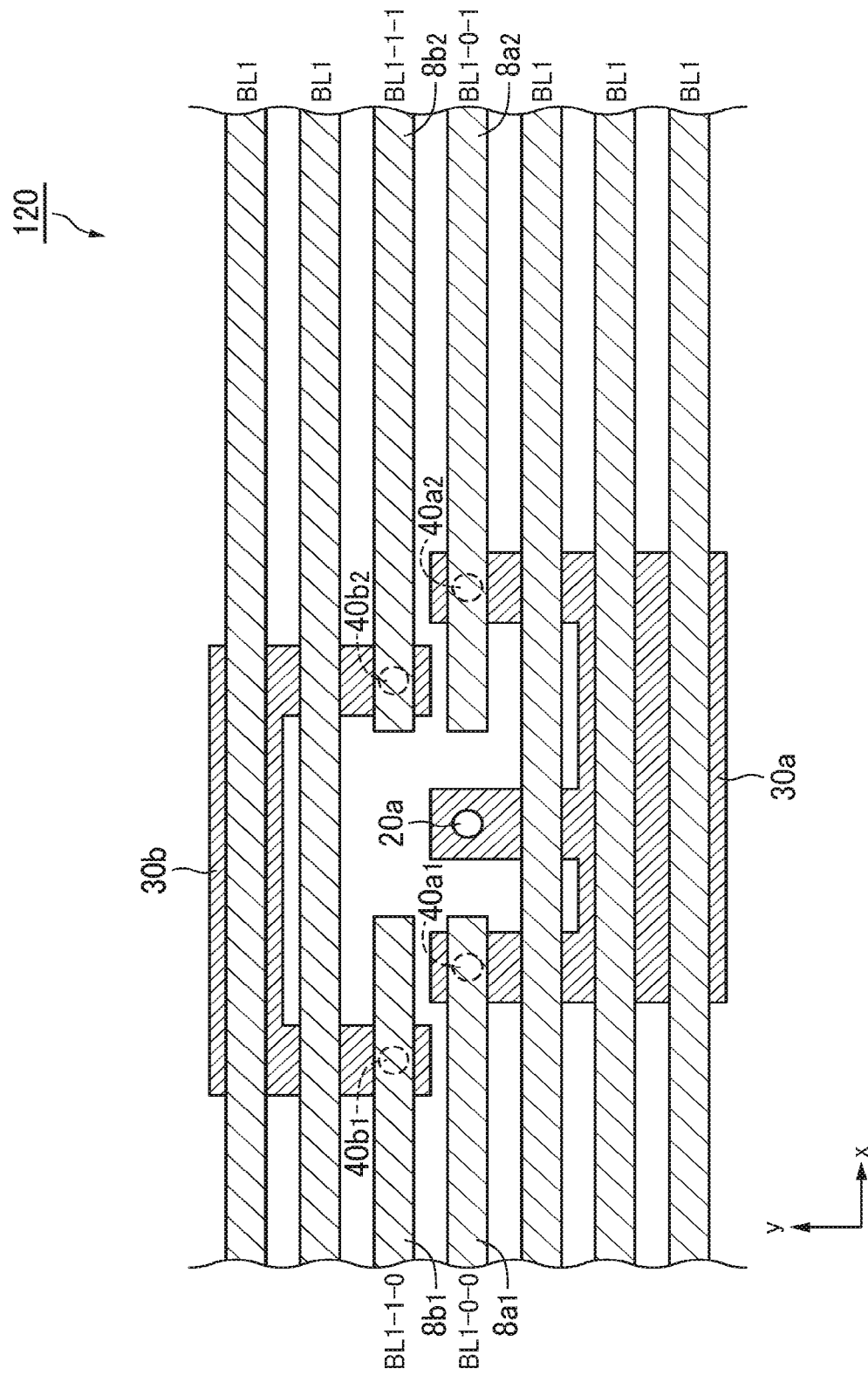
FIG. 17 is a schematic diagram showing a part of a wiring structure of a semiconductor memory device according to the second other aspect of the first embodiment.

FIG. 17 is a schematic diagram showing a part of a wiring structure of a semiconductor memory device 120 according to the second other aspect of the present embodiment. The semiconductor memory device 120 is different from the semiconductor memory device 100 and the semiconductor memory device 110 in that BL1 provided separately is BL1-0-0 $8a_1$, BL1-0-1 $8a_2$, BL1-1-0 $8b_1$, and BL1-1-1 $8b_2$. Further, the semiconductor memory device 120 is different from the semiconductor memory device 100 and the semiconductor memory device 110 at the following points. The semiconductor memory device 120 includes BL1-1-0 $8b_1$ (an example of the ninth wiring) provided to be separated from BL1-0-0 $8a_1$ (an example of the fourth wiring) in the y direction (an example of the second direction); BL1-1-1 $8b_2$ (an example of the tenth wiring) provided to be separated from BL1-0-1 $8a_2$ (an example of the fifth wiring) in the y direction (an example of the second direction); BL1-2-0 $8c_1$ (an example of the eleventh wiring) provided to be separated from BL1-1-0 $8b_1$ (an example of the ninth wiring) and BL1-1-1 $8b_2$ (an example of the tenth wiring) in the y direction (an example of the second direction), BL1-1-0 $8b_1$ (an example of the ninth wiring) being provided between BL1-0-0 $8a_1$ (an example of the fourth wiring) and BL1-2-0 $8c_1$ (an example of the eleventh wiring), and BL1-1-1 $8b_2$ (an example of the tenth wiring) being provided between BL1-0-1 $8a_2$ (an example of the fifth wiring) and BL1-2-0 $8c_1$ (an example of the eleventh wiring); BL1-3-0 $8d_1$ (an example of the twelfth wiring) provided to be separated from BL1-2-0 $8c_1$ (an example of the eleventh wiring) in the y direction (an example of the second direction); BL2-1-0 $12b_1$ (an example of the fifteenth wiring) provided in parallel to the x direction (an example of the first direction), above the plurality of word lines WL1 10 (an example of the eighth wiring), over BL1-1-0 $8b_1$ (an example of the ninth wiring) and BL1-1-1 $8b_2$ (an example of the tenth wiring); BL2-2-0 $12c_1$ (an example of the sixteenth wiring) provided in parallel to the x direction (an example of the first direction), above the plurality of word lines WL1 10 (an example of the eighth wiring), over BL1-2-0 $8c_1$ (an example of the eleventh wiring); BL2-3-0 $12d_1$ (an example of the seventeenth wiring) provided in parallel to the x direction (an example of the first direction), above the plurality of word lines WL1 10 (an example of the eighth wiring), over BL1-3-0 $8d_1$ (an example of the twelfth wiring); BL0-1-0 $4b_1$ (an example of the eighteenth wiring) provided to be separated from BL0-0-0 $4a_1$ (an example of the first wiring) in the y direction (an example of the second direction), between the substrate 2 and BL1-1-0 $8b_1$ (an example of the ninth wiring); BL0-1-1 $4b_2$ (an example of the nineteenth wiring) provided to be separated from BL0-0-1 $4a_2$ (an example of the third wiring) in the y direction (an example of the second direction), between the substrate 2 and BL1-1-1 $8b_2$ (an example of the tenth wiring); the connection conductor 30b (an example of the eighth connection wiring) provided under BL0-1-0 $4b_1$ (an example of the eighteenth wiring) and BL0-1-1 $4b_2$ (an example of the nineteenth wiring), above the substrate 2; the via $40b_1$ (an example of the tenth connection wiring) provided between the connection conductor 30b (an example of the eighth connection wiring) and BL0-1-0 $4b_1$ (an example of the eighteenth wiring) and connected to the connection conductor 30b (an example of the eighth connection wiring) and BL0-1-0 $4b_1$ (an example of the eighteenth wiring); and the via $40b_2$ (an example of the eleventh connection wiring) provided between the connection conductor 30b (an example of the eighth connection wiring) and BL0-1-1 $4b_2$ (an example of the nineteenth wiring) and connected to the connection conductor 30b (an example of the eighth connection wiring) and BL0-1-1 $4b_2$ (an example of the nineteenth wiring).

According to the semiconductor memory device of the present embodiment, a highly reliable semiconductor memory device can be provided.

Second Embodiment

Figure 18:
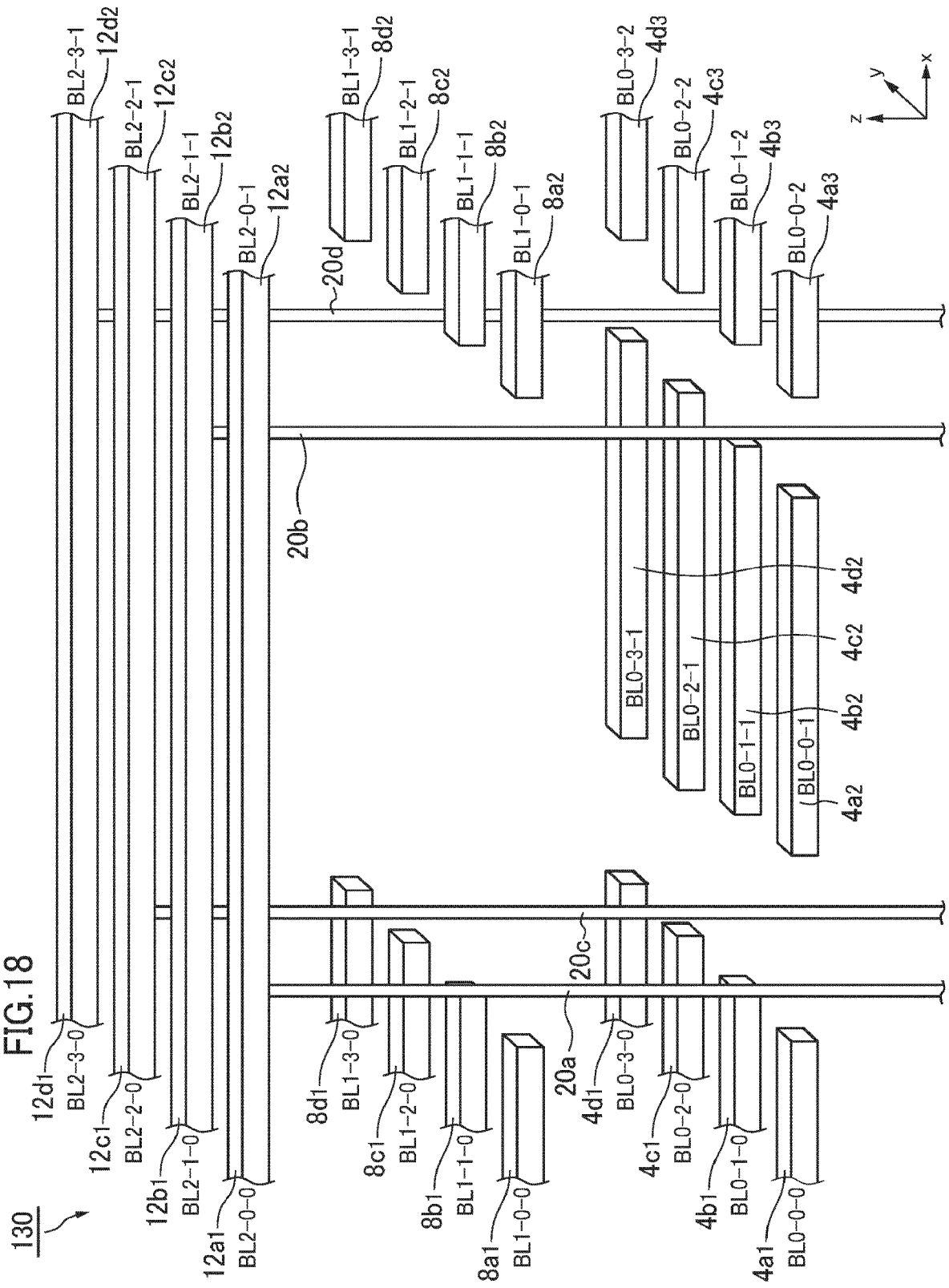
FIG. 18 is a schematic diagram showing a part of a wiring structure of a semiconductor memory device according to a second embodiment.

FIG. 18 is a schematic diagram showing a part of a wiring structure of a semiconductor memory device 130 according to the present embodiment. The semiconductor memory device 130 according to the second embodiment is different from the semiconductor device 100 according to the first embodiment in that a via 20b passes between BL0-1-1 $4b_2$ and BL0-1-2 $4b_3$ and a via 20d passes between BL0-3-1 $4d_2$ and BL0-3-2 $4d_3$. Accordingly, the semiconductor memory device 130 according to the second embodiment is further different from the semiconductor device 100 according to the first embodiment in that lengths of BL1-0-1 $8a_2$, BL1-1-1 $8b_2$, BL1-2-1 $8c_2$, and BL1-3-1 $8d_2$ in an x direction decrease.

Figure 19:
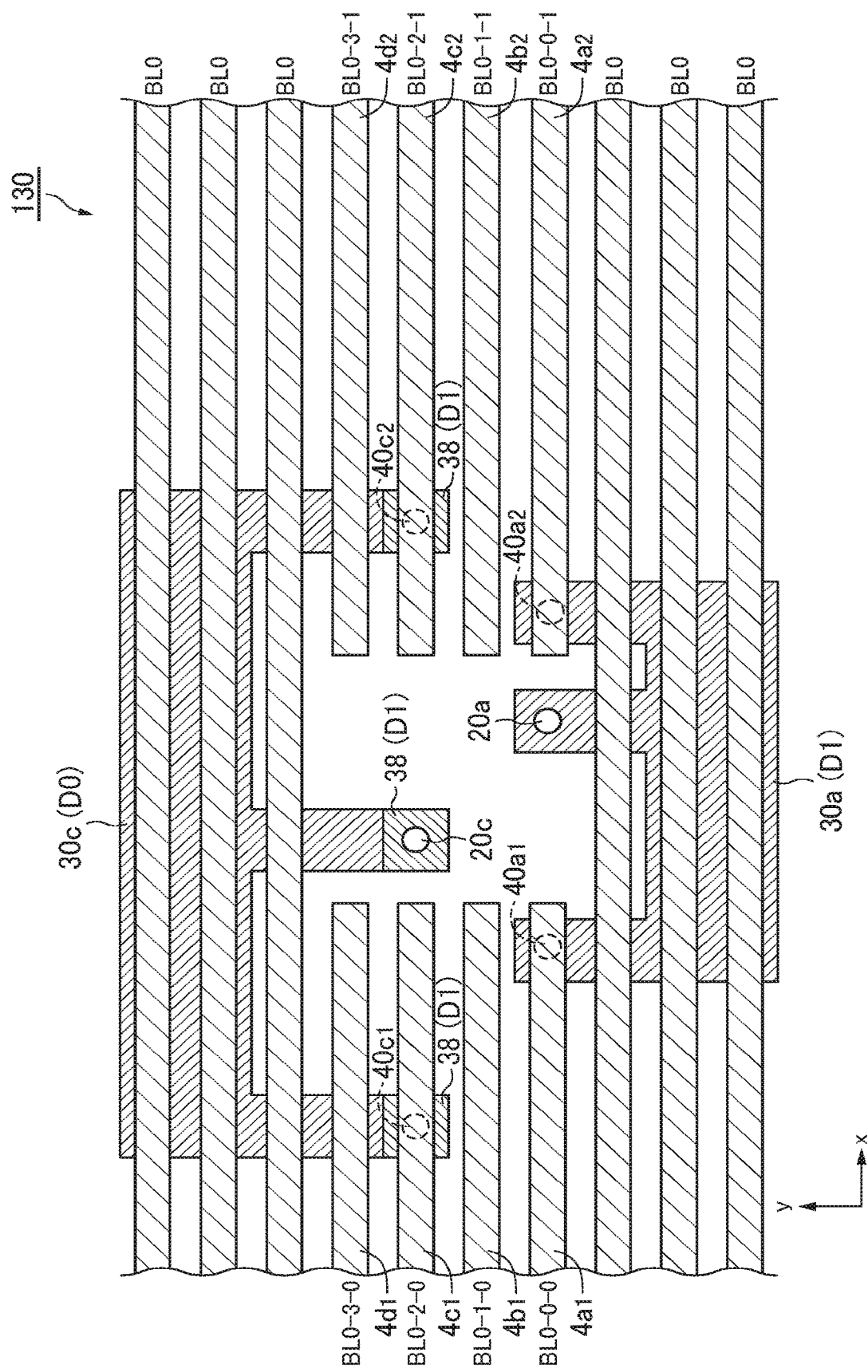
FIG. 19 is a schematic diagram showing a part of a wiring structure of the semiconductor memory device according to the second embodiment.
Figure 20:
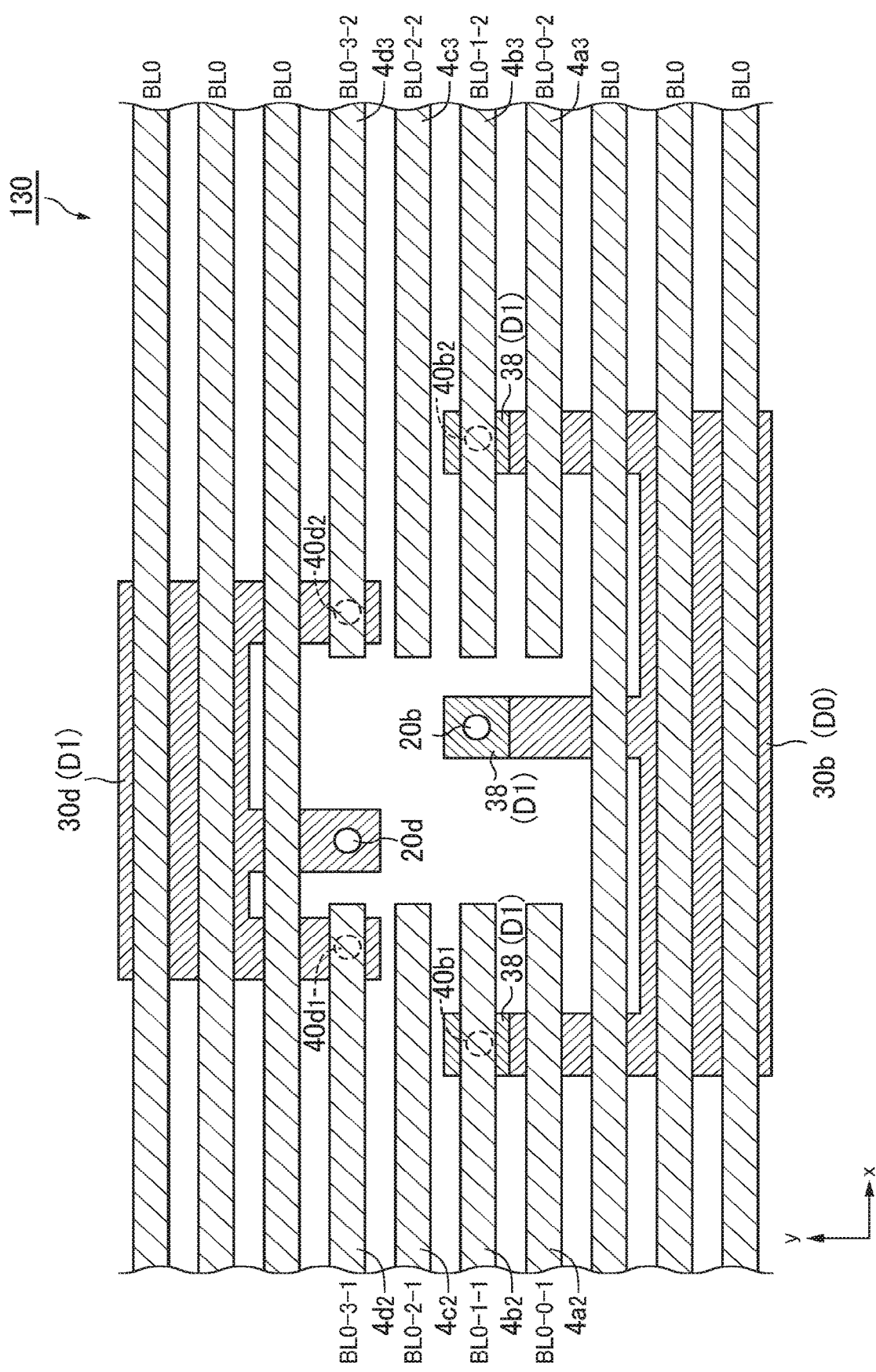
FIG. 20 is a schematic diagram showing a part of a wiring structure of the semiconductor memory device according to the second embodiment.
Figure 21:
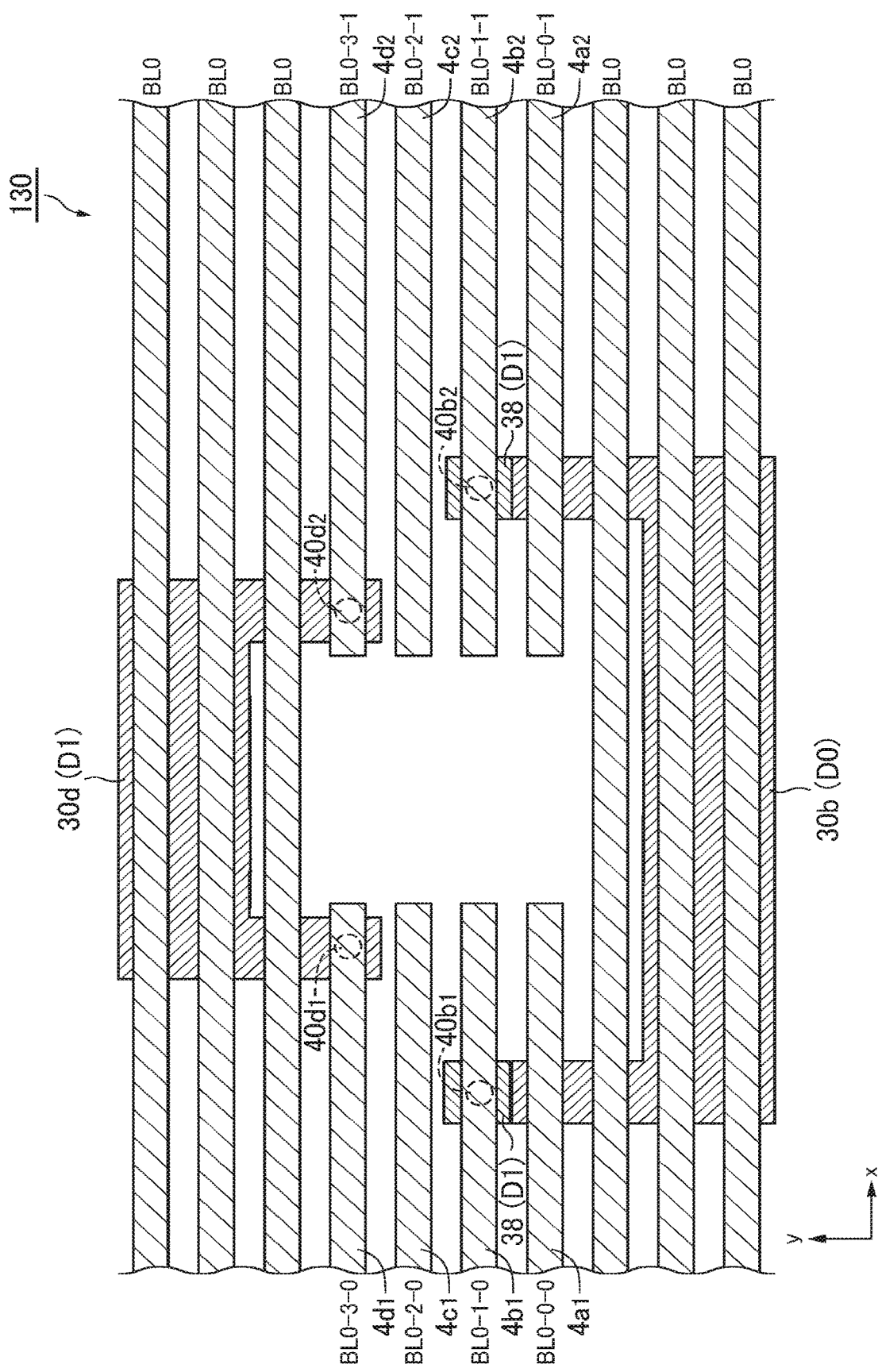
FIG. 21 is a schematic diagram showing a part of a wiring structure of the semiconductor memory device according to the second embodiment.
Figure 22:
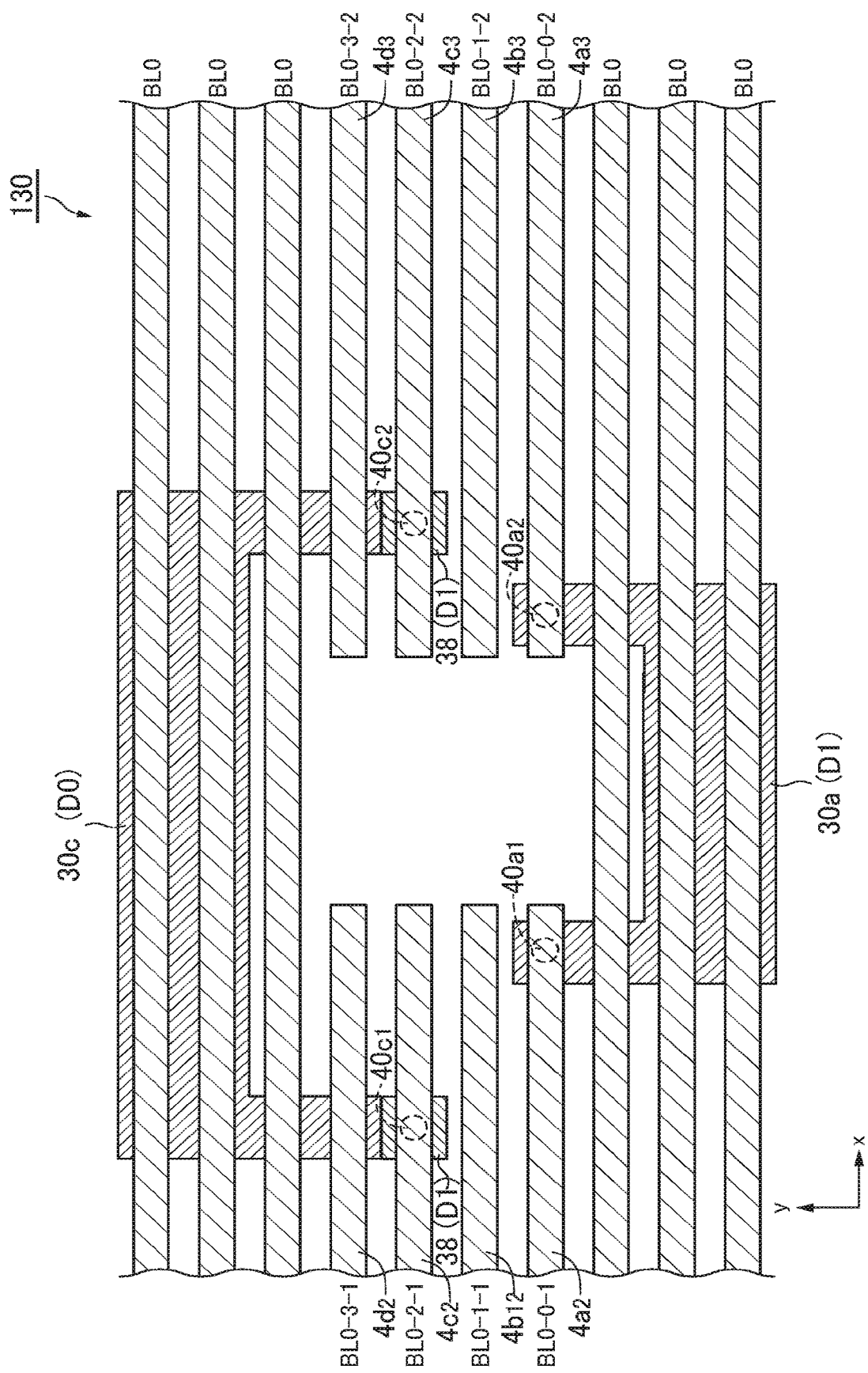
FIG. 22 is a schematic diagram showing a part of a wiring structure of the semiconductor memory device according to the second embodiment.

FIGS. 19 to 22 are schematic diagrams showing a part of a wiring structure of the semiconductor memory device 130 according to the present embodiment. FIG. 19 shows a connection aspect between vias 20a and 20c and BL0. FIG. 20 shows a connection aspect between vias 20b and 20d and BL0. FIG. 21 shows a connection aspect between BL0-1-1 $4b_2$ and BL0-1-2 $4b_3$ and a connection aspect between BL0-3-1 $4d_2$ and BL0-3-2 $4d_3$. FIG. 22 shows a connection aspect between BL0-0-1 $4a_2$ and BL0-0-2 $4a_3$ and a connection aspect between BL0-2-1 $4c_2$ and BL0-2-2 $4c_3$.

The semiconductor memory device 130 includes a substrate 2 having a substrate plane extending in an x direction (an example of a first direction) and a y direction (an example of a second direction) intersecting with the x direction; BL0-0-0 $4a_1$ (an example of a first wiring) provided above the substrate 2, BL0-0-0 $4a_1$ being provided so that a longitudinal direction extends along the x direction (an example of the first direction); BL0-0-2 $4a_3$ (an example of a second wiring) provided above the substrate 2, BL0-0-2 $4a_3$ being separated from BL0-0-0 $4a_1$ (an example of the first wiring) in the x direction (an example of the first direction), BL0-0-2 $4a_3$ being passed by the same virtual line together with BL0-0-0 4a, (an example of the first wiring), BL0-0-2 $4a_3$ being provided so that a longitudinal direction extends along the x direction (an example of the first direction); BL0-0-1 $4a_2$ (an example of a third wiring) provided between BL0-0-0 $4a_1$ (an example of the first wiring) and BL0-0-2 4a. (an example of the second wiring), BL0-0-1 $4a_2$ being separated from BL0-0-0 $4a_1$ (an example of the first wiring) and BL0-0-2 $4a_3$ (an example of the second wiring), BL0-0-1 $4a_2$ being passed by the same virtual line together with BL0-0-0 $4a_1$ (an example of the first wiring) and BL0-0-2 $4a_3$ (an example of the second wiring), BL0-0-1 $4a_2$ being provided so that a longitudinal direction extends along the x direction (an example of the first direction); BL1-0-0 $8a_1$ (an example of a fourth wiring) provided above BL0-0-0 $4a_1$ (an example of the first wiring), BL1-0-0 $8a_1$ overlapping with BL0-0-0 $4a_1$ (an example of the first wiring) when viewed from the above, BL1-0-0 $8a_1$ being provided so that a longitudinal direction extends along the x direction (an example of the first direction); BL1-0-1 $8a_2$ (an example of a fifth wiring) above BL0-0-2 $4a_3$ (an example of the second wiring), BL1-0-1 $8a_2$ being separated from BL1-0-0 $8a_1$ (an example of the fourth wiring) in the x direction (an example of the first direction), BL1-0-1 $8a_2$ overlapping with BL0-0-2 $4a_3$ (an example of the second wiring) when viewed from the above, BL1-0-1 $8a_2$ being passed by the same virtual line together with BL1-0-0 $8a_1$ (an example of the fourth wiring), BL1-0-1 $8a_2$ being provided so that a longitudinal direction extends along the x direction (an example of the first direction); BL2-0-0 $12a_1$ (an example of a sixth wiring) provided over BL1-0-0 $8a_1$ (an example of the fourth wiring) and BL1-0-1 $8a_2$ (an example of the fifth wiring), BL2-0-0 $12a_1$ overlapping with BL1-0-0 $8a_1$ (an example of the fourth wiring) and BL1-0-1 $8a_2$ (an example of the fifth wiring) when viewed from the above, BL2-0-0 $12a_1$ being provided so that a longitudinal direction extends along the x direction (an example of the first direction); a plurality of word lines WL0 6 (an example of a seventh wiring) provided between BL0-0-0 $4a_1$ (an example of the first wiring) and BL1-0-0 $8a_1$ (an example of the fourth wiring) and between BL0-0-2 $4a_3$ (an example of the second wiring) and BL1-0-1 $8a_2$ (an example of fifth wiring), the word lines WL0 6 being provided so that a longitudinal direction extends along the y direction (an example of the second direction); a plurality of word lines WL1 10 (an example of an eighth wiring) provided between BL1-0-0 $8a_1$ (an example of the fourth wiring) and BL2-0-0 $12a_1$ (an example of the sixth wiring) and between BL1-0-1 $8a_2$ (an example of the fifth wiring) and BL2-0-0 $12a_1$ (an example of the sixth wiring), the word lines WL1 being provided so that a longitudinal direction extends along the y direction (an example of the second direction); a plurality of first memory cells provided between BL0-0-0 $4a_1$ (an example of the first wiring) and BL0-0-2 $4a_3$ (an example of the second wiring) and the seventh wirings; a plurality of second memory cells provided between BL1-0-0 $8a_1$ (an example of the fourth wiring) and BL1-0-1 $8a_2$ (an example of the fifth wiring) and the seventh wirings, the second memory cells overlapping with the first memory cells when viewed from the above; a plurality of third memory cells provided between BL1-0-0 $8a_1$ (an example of the fourth wiring) and BL1-0-1 $8a_2$ (an example of the fifth wiring) and the word lines WL1 10 (an example of the eighth wiring); a plurality of fourth memory cells provided between BL2-0-0 $12a_1$ (an example of the sixth wiring) and the word lines WL1 10 (an example of the eighth wiring), the fourth memory cells overlapping with the third memory cells when viewed from the above; a connection conductor 30a (in FIG. 19, an example of a first connection wiring) provided above the substrate 2, the connection conductor 30a being provided at least partially under a portion where BL0-0-0 $4a_1$ (an example of the first wiring) and BL0-0-1 $4a_2$ (an example of the third wiring) are separated; a via 20a (an example of a second connection wiring) provided between BL0-0-0 $4a_1$ (an example of the first wiring) and BL0-0-1 $4a_2$ (an example of the third wiring) so that a longitudinal direction extends in a z direction (an example of a third direction) intersecting with the x direction and the y direction, the via 20a connecting BL2-0-0 $12a_1$ (an example of the sixth wiring) and the connection conductor 30a (in FIG. 19, an example of the first connection wiring); a via $40a_1$ (in FIG. 19, an example of a third connection wiring) connecting BL0-0-0 $4a_1$ (an example of the first wiring) and the connection conductor 30a (in FIG. 19, an example of the first connection wiring); and a via $40a_2$ (in FIG. 19, an example of a fourth connection wiring) connecting BL0-0-1 $4a_2$ (an example of the third wiring) and the connection conductor 30a (in FIG. 19, an example of the first connection wiring).

The semiconductor memory device 130 further includes BL1-1-0 $8b_1$ (an example of a ninth wiring) provided to be separated from BL1-0-0 $8a_1$ (an example of a fourth wiring) in the y direction (an example of the second direction); BL1-2-0 $8c_1$ (an example of a tenth wiring) provided to be separated from BL1-1-0 $8b_1$ (an example of the ninth wiring) in the y direction (an example of the second direction), BL1-1-0 $8b_1$ (example of the ninth wiring) being provided between BL1-0-0 $8a_1$ (an example of the fourth wiring) and BL1-2-0 $8c_1$ (an example of the tenth wiring); BL1-3-0 $8d_1$ (an example of an eleventh wiring) provided to be separated from BL1-2-0 $8c_1$ (an example of the tenth wiring) in the y direction (an example of the second direction), BL1-2-0 $8c_1$ (an example of the tenth wiring) being provided between BL1-3-0 $8d_1$ (an example of the eleventh wiring) and BL1-1-0 $8b_1$ (an example of the ninth wiring); BL1-1-1 $8b_2$ (an example of a twelfth wiring) provided to be separated from BL1-0-1 $8a_2$ (an example of the fifth wiring) in the y direction (an example of the second direction) and to be separated from BL1-1-0 $8b_1$ (an example of the ninth wiring) in the x direction (an example of the first direction); BL1-2-1 $8c_2$ (an example of a thirteenth wiring) provided to be separated from BL1-1-1 $8b_2$ (an example of the twelfth wiring) in the y direction (an example of the second direction) and to be separated from BL1-2-0 $8c_1$ (an example of the tenth wiring) in the x direction (an example of the first direction), BL1-1-1 $8b_2$ (an example of the twelfth wiring) being provided between BL1-0-1 $8a_2$ (an example of the fifth wiring) and BL1-2-1 $8c_2$ (an example of the thirteenth wiring); BL1-3-1 $8d_2$ (an example of a fourteenth wiring) provided to be separated from BL1-2-1 $8c_2$ (an example of the thirteenth wiring) in the y direction (an example of the second direction) and to be separated from BL1-3-0 $8d_1$ (an example of the eleventh wiring) in the x direction (an example of the first direction), BL1-2-1 $8c_2$ (an example of the thirteenth wiring) being provided between BL1-1-1 $8b_2$ (an example of the twelfth wiring) and BL1-3-1 $8d_2$ (an example of the fourteenth wiring); BL2-1-0 $12b_1$ (an example of a fifteenth wiring) provided over BL1-1-0 $8b_1$ (an example of the ninth wiring) and BL1-1-1 $8b_2$ (an example of the twelfth wiring), BL2-1-0 $12b_1$ overlapping with BL1-1-0 $8b_1$ (an example of the ninth wiring) and BL1-1-1 $8b_2$ (an example of the twelfth wiring) when viewed from the above, BL2-1-0 $12b_1$ being provided above the word lines WL1 10 (an example of the eighth wiring), BL2-1-0 $12b_1$ being provided so that a longitudinal direction extends along the x direction (an example of the first direction); BL2-2-0 $12c_2$ (an example of a sixteenth wiring) provided over BL1-2-0 $8c_1$ (an example of the tenth wiring) and BL1-2-1 $8c_2$ (an example of the thirteenth wiring), BL2-2-0 $12c_1$ overlapping with BL1-2-0 $8c_1$ (an example of the tenth wiring) and BL1-2-1 $8c_2$ (an example of the thirteenth wiring) when viewed from the above, BL2-2-0 $12c_1$ being BL2-2-0 $12c_1$ being provided above the word lines WL1 10 (an example of the eighth wiring), BL2-2-0 $12c_1$ being provided so that a longitudinal direction extends along the x direction (an example of the first direction); BL2-3-0 $12d_1$ (an example of a seventeenth wiring) provided over BL1-3-0 $8d_1$ (an example of the eleventh wiring) and BL1-3-1 $8d_2$ (an example of the fourteenth wiring), BL2-3-0 $12d_1$ overlapping with BL1-3-0 $8d_1$ (an example of the eleventh wiring) and BL1-3-1 $8d_2$ (an example of the fourteenth wiring) when viewed from the above, BL2-3-0 $12d_1$ being provided above the word lines WL1 10 (an example of the eighth wiring), BL2-3-0 $12d_1$ being provided so that a longitudinal direction extends along the x direction (an example of the first direction); BL0-1-0 $4b_1$ (an example of an eighteenth wiring) provided between the substrate and BL1-1-0 $8b_1$ (an example of the ninth wiring), BL0-1-0 $4b_1$ overlapping with BL1-1-0 $8b_1$ (an example of the ninth wiring) when viewed from the above, BL0-1-0 $4b_1$ being separated from BL0-0-0 $4a_1$ (an example of the first wiring) in the y direction (an example of the second direction); BL0-2-0 $4c_1$ (an example of a nineteenth wiring) provided between the substrate and BL1-2-0 $8c_1$ (an example of the tenth wiring), BL0-2-0 $4c_1$ overlapping with BL1-2-0 $8c_1$ (an example of the tenth wiring) when viewed from the above, BL0-2-0 $4c_1$ being provided to be separated from BL0-1-0 $4b_1$ (an example of the eighteenth wiring) in the y direction (an example of the second direction); BL0-3-0 $4d_1$ (an example of a twentieth wiring) provided between the substrate and BL1-3-0 $8d_1$ (an example of the eleventh wiring), BL0-3-0 $4d_1$ overlapping with BL1-3-0 $8d_1$ (an example of the eleventh wiring) when viewed from the above, BL0-3-0 $4d_1$ being separated from BL0-2-0 $4c_1$ (an example of the nineteenth wiring) in the y direction (an example of the second direction); BL0-1-1 $4b_2$ (an example of a twenty-first wiring) provided between the substrate and BL2-1-0 $12b_1$ (an example of the fifteenth wiring), BL0-1-1 $4b_2$ overlapping with BL2-1-0 $12b_1$ (an example of the fifteenth wiring) when viewed from the above, BL0-1-1 $4b_2$ being provided to be separated from BL0-0-1 $4a_2$ (an example of the third wiring) in the y direction (an example of the second direction) and to be separated from BL0-1-0 $4b_1$ (an example of the eighteenth wiring) in the x direction (an example of the first direction); BL0-2-1 $4c_2$ (an example of a twenty-second wiring) provided between the substrate and BL2-2-0 $12c_1$ (an example of the sixteenth wiring), BL0-2-1 $4c_2$ overlapping with BL2-2-0 $12c_1$ (an example of the sixteenth wiring) when viewed from the above, BL0-2-1 $4c_2$ being provided to be separated from BL0-1-1 $4b_2$ (an example of the twenty-first wiring) in the y direction (an example of the second direction) and to be separated from BL0-2-0 $4c_1$ (an example of the nineteenth wiring) in the x direction (an example of the first direction); BL0-3-1 $4d_2$ (an example of a twenty-third wiring) provided between the substrate and BL2-3-0 $12d_1$ (an example of the seventeenth wiring), BL0-3-1 $4d_2$ overlapping with BL2-3-0 $12d_1$ (an example of the seventeenth wiring) when viewed from the above, BL0-3-1 $4d_2$ being provided to be separated from BL0-2-1 $4c_2$ (an example of the twenty-second wiring) in the y direction (an example of the second direction) and to be separated from BL0-3-0 $4d_1$ (an example of the twentieth wiring) in the x direction (an example of the first direction); BL0-1-2 $4b_3$ (an example of a twenty-fourth wiring) overlapping with BL1-1-1 $8b_2$ (an example of the twelfth wiring) when viewed from the above, BL0-1-2 $4b_3$ being provided to be separated from a second wiring in the y direction (an example of the second direction) and to be separated from BL0-1-1 $4b_2$ (an example of the twenty-first wiring) in the x direction (an example of the first direction); BL0-2-2 $4c_3$ (an example of a twenty-fifth wiring) overlapping with BL1-2-1 $8c_2$ (an example of the thirteenth wiring) when viewed from the above, BL0-2-2 $4c_3$ being provided to be separated from BL0-1-2 $4b_3$ (an example of the twenty-fourth wiring) in the y direction (an example of the second direction) and to be separated from BL0-2-1 $4c_2$ (an example of the twenty-second wiring) in the x direction (an example of the first direction); BL0-3-2 $4d_3$ (an example of a twenty-sixth wiring) overlapping with BL1-3-1 $8d_2$ (an example of the fourteenth wiring) when viewed from the above, BL0-3-2 $4d_3$ being provided to be separated from BL0-2-2 $4c_3$ (an example of the twenty-fifth wiring) in the y direction (an example of the second direction) and to be separated from BL0-3-1 $4d_2$ (an example of the twenty-third wiring) in the x direction (an example of the first direction); a connection conductor 30b (in FIG. 20, an example of a fifth connection wiring) provided above the substrate, the connection conductor 30b being provided at least partially under a portion where BL0-0-2 $4a_3$ (an example of the second wiring) and BL0-0-1 $4a_2$ (an example of the third wiring) are separated; a via 20b (in FIG. 20, an example of a sixth connection wiring) provided between BL0-1-1 $4b_2$ (an example of the twenty-first wiring) and BL0-1-2 $4b_3$ (an example of the twenty-fourth wiring) so that a longitudinal direction extends along the z direction, the via 20b connecting BL2-1-0 $12b_1$ (an example of the fifteenth wiring) and the connection conductor 30b (an example of the fifth connection wiring); a via $40b_1$ (in FIG. 20, an example of a seventh connection wiring) connecting BL0-1-1 $4b_2$ (an example of the twenty-first wiring) and the connection conductor 30b (an example of the fifth connection wiring); a via $40b_2$ (in FIG. 20, an example of an eighth connection wiring) connecting BL0-1-2 $4b_3$ (an example of the twenty-fourth wiring) and the connection conductor 30b (an example of the fifth connection wiring); a connection conductor 30c (in FIG. 19, an example of a ninth connection wiring) provided above the substrate, the connection conductor 30c being provided at least partially under a portion where BL0-2-0 $4c_1$ (an example of the nineteenth wiring) and BL0-2-1 $4c_2$ (an example of the twenty-second wiring) are separated; a via 20c (in FIG. 19, an example of a tenth connection wiring) provided between BL1-2-0 $8c_1$ (an example of the tenth wiring) and BL1-2-1 $8c_2$ (an example of the thirteenth wiring), the via 20c connecting BL2-2-0 $12c_1$ (an example of the sixteenth wiring) and the connection conductor 30c (an example of the ninth connection wiring); a via $40c_1$ (FIG. 19, an example of an eleventh connection wiring) connecting BL0-2-0 $4c_1$ (an example of the nineteenth wiring) and the connection conductor 30c (an example of the ninth connection wiring); a via $40c_2$ (in FIG. 19, an example of a twelfth connection wiring) connecting BL0-2-1 $4c_2$ (an example of the twenty-second wiring) and the connection conductor 30c (an example of the ninth connection wiring); a connection conductor 30d (in FIG. 20, an example of a thirteenth connection wiring) provided above the substrate, the connection conductor 30d being provided at least partially under a portion where BL0-3-1 $4d_2$ (an example of the twenty-third wiring) and BL0-3-2 $4d_3$ (an example of the twenty-sixth wiring) are separated; a via 20d (in FIG. 20, an example of a fourteenth connection wiring) provided between BL0-3-1 $4d_2$ (an example of the twenty-third wiring) and BL0-3-2 $4d_3$ (an example of the twenty-sixth wiring) so that a longitudinal direction extends along the z direction, the via 20d connecting BL2-3-0 $12d_1$ (an example of the seventeenth wiring) and the connection conductor 30d (an example of the thirteenth connection wiring); a via $40d_1$ (in FIG. 20, an example of a fifteenth connection wiring) connecting BL0-3-1 $4d_2$ (an example of the twenty-third wiring) and the connection conductor 30d (an example of the thirteenth connection wiring); and a via $40d_2$ (in FIG. 20, an example of a sixteenth connection wiring) connecting BL0-3-2 $4d_3$ (an example of the twenty-sixth wiring) and the connection conductor 30d (an example of the thirteenth connection wiring).

According to the semiconductor memory device 130 of the present embodiment, even when connection wirings from a bit line BL2 to a virtual plane 70 and a virtual plane 72 (a wiring layer D0 and a wiring layer D1) cannot be disposed with high density, the bit line BL can be reliably connected.

According to the semiconductor memory device of the present embodiment, a highly reliable semiconductor memory device can be provided.

Third Embodiment

Figure 23:
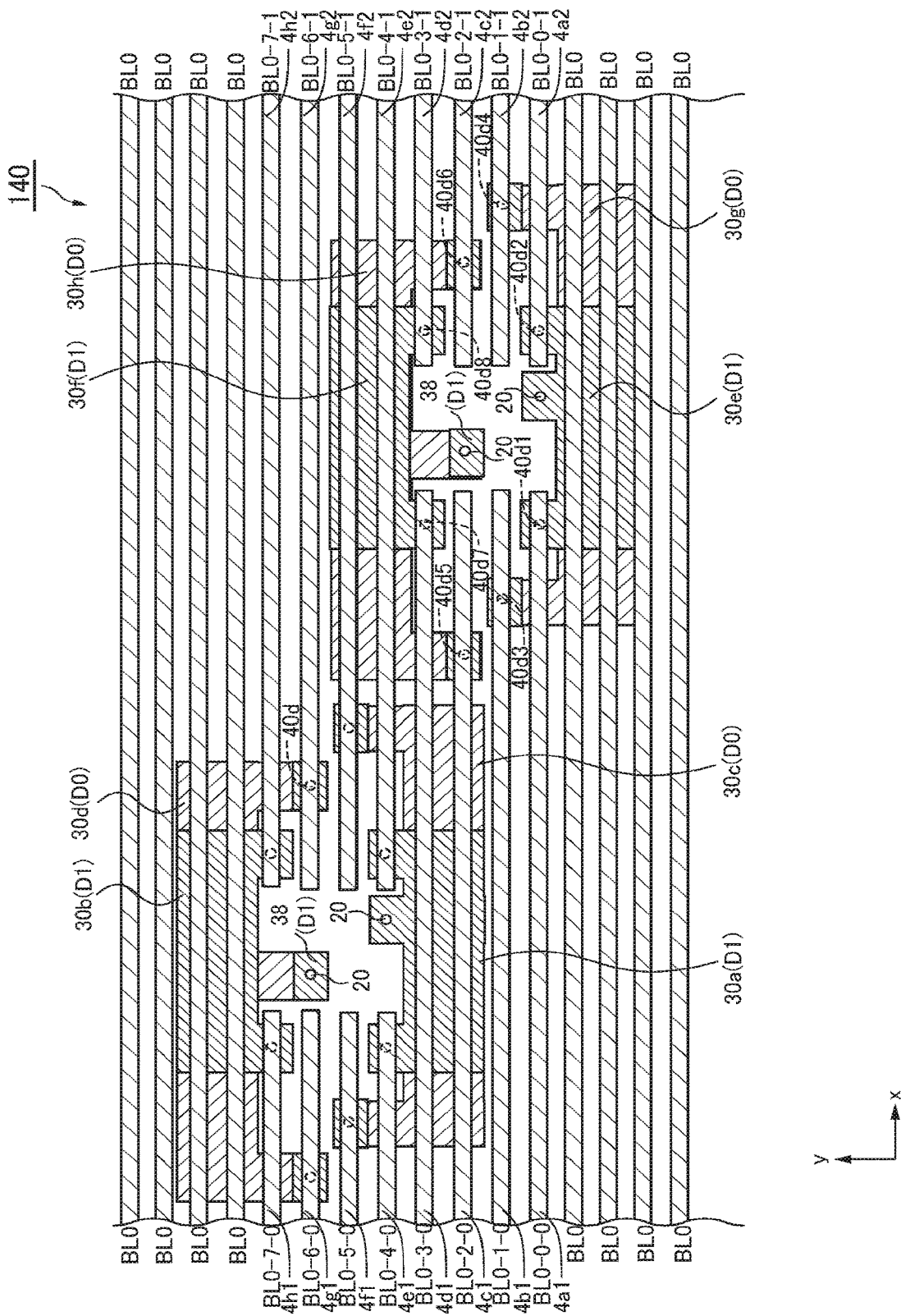
FIG. 23 is a schematic diagram showing a part of a wiring structure of a semiconductor memory device according to a third embodiment.
Figure 24:
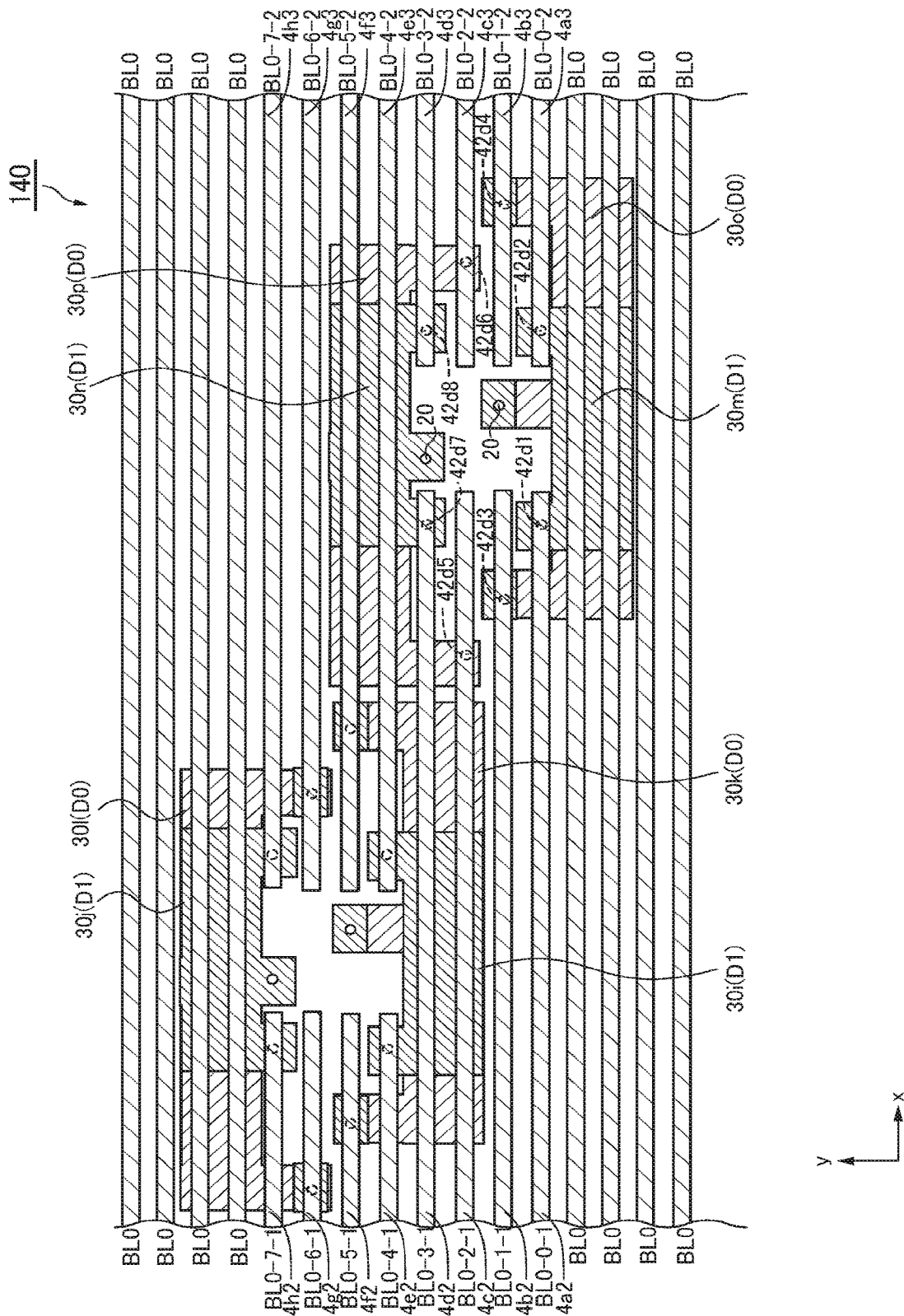
FIG. 24 is a schematic diagram showing a part of a wiring structure of the semiconductor memory device according to the third embodiment.

FIGS. 23 and 24 are schematic diagrams showing a part of a wiring structure of a semiconductor memory device 140 according to the present embodiment. FIG. 23 shows a connection aspect of odd bit lines BL (BL0-0-0 $4a_1$, BL0-0-1 $4a_2$, BL0-2-0 $4c_1$, BL0-2-1 $4c_2$, BL0-4-0 $4e_1$, BL0-4-1 $4e_2$, BL0-6-0 $4g_1$, and BL0-6-1 $4g_2$) and a via 20. FIG. 24 shows a connection aspect of even bit lines BL (BL0-1-1 $4b_2$, BL0-1-2 $4b_3$, BL0-3-1 $4d_2$, BL0-3-2 $4d_3$, BL0-5-1 $4f_2$, and BL0-5-2 $4f_3$) and the via 20.

As shown in FIG. 23, BL0-0-0 $4a_1$ and BL0-0-1 $4a_2$ are connected by a connection conductor 30e (D1) and are further connected to the via 20. BL0-1-0 $4b_1$ and BL0-1-1 $4b_2$ are connected by a connection conductor 30g (D0). BL0-2-0 $4c_1$ and BL0-2-1 $4c_2$ are connected by a connection conductor 30h (D0) and are further connected to the via 20. BL0-3-0 $4d_1$ and BL0-3-1 $4d_2$ are connected by a connection conductor 30f (D1). BL0-4-0 $4e_1$ and BL0-4-1 $4e_2$ are connected by a connection conductor 30a (D1) and are further connected to the via 20. BL0-5-0 $4f_1$ and BL0-5-1 $4f_2$ are connected by a connection conductor 30c (D0). BL0-6-0 $4g_1$ and BL0-6-1 $4g_2$ are connected by a connection conductor 30d (D0). BL0-7-0 $4h_1$ and BL0-7-1 $4h_2$ are connected by a connection conductor 30b (D1).

As shown in FIG. 24, BL0-0-1 $4a_2$ and BL0-0-2 $4a_3$ are connected by a connection conductor 30m (D1). BL0-1-1 $4b_2$ and BL0-1-2 $4b_3$ are connected by a connection conductor 30o (D0) and are further connected to the via 20. BL0-2-1 $4c_2$ and BL0-2-2 $4c_3$ are connected by a connection conductor 30p (D0). BL0-3-1 $4d_2$ and BL0-3-2 $4d_3$ are connected by a connection conductor 30n (D1) and are further connected to the via 20. BL0-4-1 $4e_2$ and BL0-4-2 $4e_3$ are connected by a connection conductor 30i (D1). BL0-5-1 $4f_2$ and BL0-5-2 $4f_3$ are connected by a connection conductor 30k (D0) and are further connected to the via 20. BL0-6-1 $4g_2$ and BL0-6-2 $4g_3$ are connected by the connection conductor 30l (D0). BL0-7-1 $4h_2$ and BL0-7-2 $4h_3$ are connected by a connection conductor 30j (D1) and are further connected to the via 20.

The semiconductor memory device 140 includes a substrate 2; BL0-0-0 $4a_1$ (an example of a first wiring) provided in parallel to an x direction (an example of a first direction) parallel to a plane of the substrate 2, above the substrate 2; BL0-0-2 $4a_3$ (an example of a second wiring) provided to be separated from BL0-0-0 $4a_1$ (an example of the first wiring) in the x direction (an example of the first direction) and in parallel to the x direction (an example of the first direction), above the substrate 2; BL0-0-1 $4a_2$ (an example of a third wiring) provided to be separated from BL0-0-0 $4a_1$ (an example of the first wiring) and BL0-0-2 $4a_3$ (an example of the second wiring) and in parallel to the x direction (an example of the first direction), between BL0-0-0 $4a_1$ (an example of the first wiring) and BL0-0-2 $4a_3$ (an example of the second wiring); BL0-1-0 $4b_1$ (an example of a fourth wiring) provided to be separated from BL0-0-0 $4a_1$ (an example of the first wiring) in a y direction (an example of a second direction) and in parallel to the x direction (an example of the first direction); BL0-1-2 $4b_3$ (an example of a fifth wiring) provided to be separated from BL0-0-2 $4a_3$ (an example of the second wiring) in the y direction (an example of the second direction), to be separated from BL0-1-0 $4b_1$ (an example of the fourth wiring) in the x direction (an example of the first direction), and in parallel to the x direction (an example of the first direction); BL0-1-1 $4b_2$ (an example of a sixth wiring) provided to be separated from BL0-1-0 $4b_1$ (an example of the fourth wiring) and BL0-1-2 $4b_3$ (an example of the fifth wiring) and in parallel to the x direction (an example of the first direction), between BL0-1-0 $4b_1$ (an example of the fourth wiring) and BL0-1-2 $4b_3$ (an example of the fifth wiring); BL0-2-0 $4c_1$ (an example of a seventh wiring) provided to be separated from BL0-1-0 $4b_1$ (an example of the fourth wiring) in the y direction (an example of the second direction), BL0-1-0 $4b_1$ (an example of the fourth wiring) being provided between BL0-0-0 $4a_1$ (an example of the first wiring) and BL0-2-0 $4c_1$ (an example of the seventh wiring); BL0-2-2 $4c_3$ (an example of an eighth wiring) provided to be separated from BL0-1-2 $4b_3$ (an example of the fifth wiring) in the y direction (an example of the second direction), BL0-1-2 $4b_3$ (an example of the fifth wiring) being provided between BL0-0-2 $4a_3$ (an example of the second wiring) and BL0-2-2 $4c_3$ (an example of the eighth wiring); BL0-2-1 $4c_2$ (an example of a ninth wiring) provided to be separated from BL0-1-1 $4b_2$ (an example of the sixth wiring) in the y direction (an example of the second direction), BL0-1-1 $4b_2$ (an example of the sixth wiring) being provided between BL0-0-1 $4a_2$ (an example of the third wiring) and BL0-2-1 $4c_2$ (an example of the ninth wiring); BL0-3-0 $4d_1$ (an example of a tenth wiring) provided to be separated from BL0-2-0 $4c_1$ (an example of the seventh wiring) in the y direction (an example of the second direction), BL0-2-0 $4c_1$ (an example of the seventh wiring) being provided between BL0-1-0 $4b_1$ (an example of the fourth wiring) and BL0-3-0 $4d_1$ (an example of the tenth wiring); BL0-3-2 $4d_3$ (an example of an eleventh wiring) provided to be separated from BL0-2-2 $4c_3$ (an example of the eighth wiring) in the y direction (an example of the second direction), BL0-2-2 $4c_3$ (an example of the eighth wiring) being provided between BL0-1-2 $4b_3$ (an example of the fifth wiring) and BL0-3-2 $4d_3$ (an example of the eleventh wiring); BL0-3-1 $4d_2$ (an example of a twelfth wiring) provided to be separated from BL0-2-1 $4c_2$ (an example of the ninth wiring) in the y direction (an example of the second direction), BL0-2-1 $4c_2$ (an example of the ninth wiring) being provided between BL0-1-1 $4b_2$ (an example of the sixth wiring) and BL0-3-1 $4d_2$ (an example of the twelfth wiring); a plurality of word lines WL0 (an example of a plurality of thirteenth wirings) provided on BL0-0-0 $4a_1$ (an example of the first wiring), BL0-0-2 $4a_3$ (an example of the second wiring), BL0-0-1 $4a_2$ (an example of the third wiring), BL0-1-0 $4b_1$ (an example of the fourth wiring), BL0-1-2 $4b_3$ (an example of the fifth wiring), BL0-1-1 $4b_2$ (an example of the sixth wiring), BL0-2-0 $4c_1$ (an example of the seventh wiring), BL0-2-2 $4c_3$ (an example of the eighth wiring), BL0-2-1 $4c_2$ (an example of the ninth wiring), BL0-3-0 $4d_2$ (an example of the tenth wiring), BL0-3-2 $4d_3$ (an example of the eleventh wiring), and BL0-3-1 $4d_2$ (an example of the twelfth wiring) and provided in parallel to the y direction (an example of the second direction); a plurality of memory cells provided between BL0-0-0 $4a_1$ (an example of the first wiring) and the plurality of word lines WL0 (an example of the plurality of thirteenth wirings), between BL0-0-2 $4a_3$ (an example of the second wiring) and the plurality of word lines WL0 (an example of the plurality of thirteenth wirings), between BL0-0-1 $4a_2$ (an example of third wiring) and the plurality of word lines WL0 (an example of the plurality of thirteenth wiring), between BL0-1-0 $4b_1$ (an example of the fourth wiring) and the plurality of word lines WL0 (an example of the plurality of thirteenth wiring), between BL0-1-2 $4b_3$ (an example of the fifth wiring) and the plurality of word lines WL0 (an example of the plurality of thirteenth wiring), between BL0-1-1 $4b_2$ (an example of the sixth wiring) and the plurality of word lines WL0 (an example of the plurality of thirteenth wiring), between BL0-2-0 $4c_1$ (an example of the seventh wiring) and the plurality of word lines WL0 (an example of the plurality of thirteenth wiring), between BL0-2-2 $4c_3$ (an example of the eighth wiring) and the plurality of word lines WL0 (an example of the plurality of thirteenth wiring), between BL0-2-1 $4c_2$ (an example of the ninth wiring) and the plurality of word lines WL0 (an example of the plurality of thirteenth wiring), between BL0-3-0 $4d_1$ (an example of the tenth wiring) and the plurality of word lines WL0 (an example of the plurality of thirteenth wiring), between BL0-3-2 $4d_3$ (an example of the eleventh wiring) and the plurality of word lines WL0 (an example of the plurality of thirteenth wiring), and between BL0-3-1 $4d_2$ (an example of the twelfth wiring) and the plurality of word lines WL0 (an example of the plurality of thirteenth wiring); a connection conductor 30e (an example of a first connection wiring) provided under a portion where BL0-0-0 $4a_1$ (an example of the first wiring) and BL0-0-1 $4a_2$ (an example of the third wiring) are separated, above the substrate 2; a via 20 (an example of a second connection wiring) provided between BL0-0-0 $4a_1$ (an example of the first wiring) and BL0-0-1 $4a_2$ (an example of the third wiring) and connected to the first connection wiring; a connection conductor $40d_1$ (an example of the third connection wiring) connecting BL0-0-0 $4a_1$ (an example of the first wiring) and the connection conductor 30e (an example of the first connection wiring); a connection conductor $40d_2$ (an example of a fourth connection wiring) connecting BL0-0-1 $4a_2$ (an example of the third wiring) and the connection conductor 30e (an example of the first connection wiring); a connection conductor 30g (an example of a fifth connection wiring) provided between the substrate 2 and the connection conductor 30e (an example of the first connection wiring); a connection conductor 40$d_3$ (an example of a sixth connection wiring) connecting BL0-1-0 4$b_1$ (an example of the fourth wiring) and the connection conductor 30g (an example of the fifth connection wiring); a connection conductor 40$d_4$ (an example of a seventh connection wiring) connecting BL0-1-1 4$b_2$ (an example of the sixth wiring) and the connection conductor 30g (an example of the fifth connection wiring); a connection conductor 30h (an example of an eighth connection wiring) provided under a portion where BL0-2-0 4$c_1$ (an example of the seventh wiring) and BL0-2-1 4$c_2$ (an example of the ninth wiring) are separated, above the substrate 2; a via 20 (an example of a ninth connection wiring) provided between BL0-2-0 4$c_1$ (an example of the seventh wiring) and BL0-2-1 4$c_2$ (an example of the ninth wiring) and connected to the connection conductor 30h (an example of the eighth connection wiring); a connection conductor 40$d_5$ (an example of a tenth connection wiring) connecting BL0-2-0 4$c_1$ (an example of the seventh wiring) and the connection conductor 30h (an example of the eighth connection wiring); a connection conductor 40$d_6$ (an example of an eleventh connection wiring) connecting BL0-2-1 4$c_2$ (an example of the ninth wiring) and a connection conductor 30h (an example of the eighth connection wiring); a connection conductor 30f (an example of a twelfth connection wiring) provided between BL0-3-0 4$d_1$ (an example of the tenth wiring) and BL0-3-1 4$d_2$ (an example of the twelfth wiring) and the connection conductor 30h (an example of the eighth connection wiring); a connection conductor 40$d_7$ (an example of a thirteenth connection wiring) connecting BL0-3-0 4$d_1$ (an example of the tenth wiring) and the connection conductor 30f (an example of the twelfth connection wiring); a connection conductor 40$d_8$ (an example of a fourteenth connection wiring) connecting BL0-3-2 4$d_3$ (an example of the eleventh wiring) and the connection conductor 30f (an example of the twelfth connection wiring);

a connecting conductor 30o (an example of a fifteenth connection wiring) provided under a portion where BL0-1-2 4$b_3$ (an example of the fifth wiring) and BL0-1-1 4$b_2$ (an example of the sixth wiring) are separated, above the substrate 2; a via 20 (an example of a sixteenth connection wiring) provided between BL0-1-2 4$b_3$ (an example of the fifth wiring) and BL0-1-1 4$b_2$ (an example of the sixth wiring) and connected to the connection conductor 30o (an example of the fifteenth connection wiring); a connection conductor 42$d_3$ (an example of a seventeenth connection wiring) connecting BL0-1-1 4$b_2$ (an example of the sixth wiring) and the connection conductor 30o (an example of the fifteenth connection wiring); a connection conductor 42$d_4$ (an example of an eighteenth connection wiring) connecting BL0-1-2 4$b_3$ (an example of the fifth wiring) and the connection conductor 30o (an example of the fifteenth connection wiring); a connection conductor 30m (an example of a nineteenth connection wiring) provided between BL0-0-2 4$a_3$ (an example of the second wiring) and BL0-0-1 4$a_2$ (an example of the third wiring) and the connection conductor 30o (an example of the fifteenth connection wiring); a connection conductor 42$d_1$ (an example of a twentieth connection wiring) connecting BL0-0-1 4$a_2$ (an example of the third wiring) and the connection conductor 30m (an example of the nineteenth connection wiring); a connection conductor 42$d_2$ (an example of a twenty-first connection wiring) connecting BL0-0-2 4$a_3$ (an example of the second wiring) and the connection conductor 30m (an example of the nineteenth connection wiring); a connection conductor 30n (an example of a twenty-second connection wiring) provided under a portion where BL0-3-2 4$d_3$ (an example of the eleventh wiring) and BL0-3-1 4$d_2$ (an example of the twelfth wiring) are separated, above the substrate 2; a via 20 (an example of a twenty-third connection wiring) connected between BL0-3-2 4$d_3$ (an example of the eleventh wiring) and BL0-3-1 4$d_2$ (an example of the twelfth wiring) and connected to the connection conductor 30n (an example of the twenty-second connection wiring); a connection conductor 42$d_7$ (an example of a twenty-fourth connection wiring) connecting BL0-3-1 4$d_2$ (an example of the twelfth wiring) and the connection conductor 30n (an example of the twenty-second connection wiring); a connection conductor 42$d_8$ (an example of a twenty-fifth connection wiring) connecting BL0-3-2 4$d_3$ (an example of the eleventh wiring) and the connection conductor 30n (an example of the twenty-second connection wiring); a connection conductor 30p (an example of a twenty-sixth connection wiring) provided between the substrate 2 and the connection conductor 30n (an example of the twenty-second connection wiring); a connection conductor 42$d_5$ (an example of a twenty-seventh connection wiring) connecting BL0-2-1 4$c_2$ (an example of the ninth wiring) and the connection conductor 30p (an example of the twenty-sixth connection wiring); and a connection conductor 42$d_6$ (an example of a twenty-eighth connection wiring) connecting BL0-2-2 4$c_3$ (an example of the eighth wiring) and the connection conductor 30p (an example of the twenty-sixth connection wiring). According to the semiconductor memory device 140 of the present embodiment, for example, a driver for an even bit line BL and a driver for an odd bit line BL can be disposed separately. The arrangement of the driver for the even bit line BL and the driver for the odd bit line BL is not limited. For example, the driver for the even bit line BL can be disposed in a region corresponding to the left side in FIG. 23, and the driver for the odd bit line BL can be disposed in a region corresponding to the right side in FIG. 23.

According to the semiconductor memory device of the present embodiment, a highly reliable semiconductor memory device can be provided.

Although some embodiments and examples of the present invention have been described, these embodiments and examples are presented as examples and are not intended to limit the scope of the invention. These novel embodiments can be implemented in various other forms, and various omissions, replacements, and changes can be made without departing from the gist of the invention. These embodiments and modifications thereof are included in the scope and the gist of the invention, and are included in the scope of the invention described in the claims and the equivalents thereof.

While certain embodiments have been described, these embodiments have been presented by way of example only, and are not intended to limit the scope of the inventions. Indeed, a semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate having a substrate plane extending in a first direction and a second direction intersecting with the first direction;
a first wiring provided above the substrate, the first wiring being provided so that a longitudinal direction extends along the first direction;
a second wiring provided above the substrate, the second wiring being separated from the first wiring in the first direction, the second wiring being passed by the same virtual line together with the first wiring, the second wiring being provided so that a longitudinal direction extends along the first direction;
a third wiring provided between the first wiring and the second wiring, the third wiring being separated from the first wiring and the second wiring, the third wiring being passed by the same virtual line together with the first wiring and the second wiring, the third wiring being provided so that a longitudinal direction extends along the first direction;
a fourth wiring provided above the first wiring, the fourth wiring overlapping with the first wiring when viewed from the above, the fourth wiring being provided so that a longitudinal direction extends along the first direction;
a fifth wiring provided over the second wiring and the third wiring, the fifth wiring being separated from the fourth wiring in the first direction, the fifth wiring overlapping with the second wiring and the third wiring when viewed from the above, the fifth wiring being passed by the same virtual line together with the fourth wiring, the fifth wiring being provided so that a longitudinal direction extends along the first direction;
a sixth wiring provided over the fourth wiring and the fifth wiring, the sixth wiring overlapping with the fourth wiring and the fifth wiring when viewed from the above, the sixth wiring being provided so that a longitudinal direction extends along the first direction;
a plurality of seventh wirings provided between the first wiring and the fourth wiring, between the third wiring and the fifth wiring, and between the second wiring and the fifth wiring, the seventh wirings being provided so that a longitudinal direction extends along the second direction;
a plurality of eighth wirings provided between the fourth wiring and the sixth wiring and between the fifth wiring and the sixth wiring, the eighth wirings being provided so that a longitudinal direction extends along the second direction;
a plurality of first memory cells provided between the first wiring, the second wiring, and the third wiring and the seventh wirings;
a plurality of second memory cells provided between the fourth wiring and the seventh wirings and between the fifth wiring and the seventh wirings, the second memory cells overlapping with the first memory cells when viewed from the above;
a plurality of third memory cells provided between the fourth wiring and the eighth wirings and between the fifth wiring and the eighth wirings, the third memory cells overlapping with the second memory cells when viewed from the above;
a plurality of fourth memory cells provided between the sixth wiring and the eighth wirings, the fourth memory cells overlapping with the third memory cells when viewed from the above;
a first connection wiring provided above the substrate, the first connection wiring being provided at least partially under a portion where the first wiring and the third wiring are separated;
a second connection wiring provided between the first wiring and the third wiring so that a longitudinal direction extends along a third direction intersecting with the first direction and the second direction, the second connection wiring connecting the sixth wiring and the first connection wiring;
a third connection wiring configured to connect the first wiring and the first connection wiring;
a fourth connection wiring configured to connect the third wiring and the first connection wiring;
a fifth connection wiring provided above the substrate, the fifth connection wiring being provided at least partially under a portion where the second wiring and the third wiring are separated; and
a sixth connection wiring provided between the second wiring and the third wiring so that a longitudinal direction extends along the third direction, the sixth connection wiring connecting the fifth wiring and the fifth connection wiring.

2. The semiconductor memory device according to claim 1, further comprising a first selected voltage generation circuit provided in the substrate under the first connection wiring, wherein the first selected voltage generation circuit is connected to the first connection wiring.

3. The semiconductor memory device according to claim 1, further comprising:
a first unselected voltage generation circuit provided in the substrate under the first wiring or under the third wiring; and
a seventh connection wiring configured to connect the first wiring or the third wiring and the first unselected voltage generation circuit.

4. The semiconductor memory device according to claim 1, further comprising a second unselected voltage generation circuit provided in the substrate under the fifth connection wiring, wherein the second unselected voltage generation circuit is connected to the fifth connection wiring.

5. The semiconductor memory device according to claim 1, further comprising: a second selected voltage generation circuit provided in the substrate under the second wiring or under the third wiring, wherein the second selected voltage generation circuit is connected to the fifth connection wiring.

6. The semiconductor memory device according to claim 1, further comprising:
a first selected voltage generation circuit provided in the substrate under the first connection wiring, the first selected voltage generation circuit being connected to the first connection wiring; and
a third selected voltage generation circuit provided in the substrate under the first connection wiring,
wherein an unselected voltage generation circuit is not disposed between the first selected voltage generation circuit and the third selected voltage generation circuit, in the first direction.

7. The semiconductor memory device according to claim 1, further comprising:
a ninth wiring provided to be separated from the fourth wiring in the second direction;
a tenth wiring provided to be separated from the ninth wiring in the second direction, the ninth wiring being provided between the fourth wiring and the tenth wiring;

an eleventh wiring provided to be separated from the tenth wiring in the second direction, the tenth wiring being provided between the eleventh wiring and the ninth wiring;

a twelfth wiring provided to be separated from the fifth wiring in the second direction and to be separated from the ninth wiring in the first direction;

a thirteenth wiring provided to be separated from the twelfth wiring in the second direction and to be separated from the tenth wiring in the first direction, the twelfth wiring being provided between the fifth wiring and the thirteenth wiring;

a fourteenth wiring provided to be separated from the thirteenth wiring in the second direction and to be separated from the eleventh wiring in the first direction, the thirteenth wiring being provided between the twelfth wiring and the fourteenth wiring;

a fifteenth wiring provided over the ninth wiring and the twelfth wiring, the fifteenth wiring overlapping with the ninth wiring and the twelfth wiring when viewed from the above, the fifteenth wiring being provided above the eighth wirings, the fifteenth wiring being provided so that a longitudinal direction extends along the first direction;

a sixteenth wiring provided over the tenth wiring and the thirteenth wiring, the sixteenth wiring overlapping with the tenth wiring and the thirteenth wiring when viewed from the above, the sixteenth wiring being provided above the eighth wirings, the sixteenth wiring being provided so that a longitudinal direction extends along the first direction;

a seventeenth wiring provided over the eleventh wiring and the fourteenth wiring, the seventeenth wiring overlapping with the eleventh wiring and the fourteenth wiring when viewed from the above, the seventeenth wiring being provided above the eighth wirings, the seventeenth wiring being provided so that a longitudinal direction extends along the first direction;

an eighteenth wiring provided between the substrate and the ninth wiring, the eighteenth wiring overlapping with the ninth wiring when viewed from the above, the eighteenth wiring being provided to be separated from the first wiring in the second direction;

a nineteenth wiring provided between the substrate and the tenth wiring, the nineteenth wiring overlapping with the tenth wiring when viewed from the above, the nineteenth wiring being provided to be separated from the eighteenth wiring in the second direction;

a twentieth wiring provided between the substrate and the eleventh wiring, the twentieth wiring overlapping with the eleventh wiring when viewed from the above, the twentieth wiring being provided to be separated from the nineteenth wiring in the second direction;

a twenty-first wiring provided between the substrate and the twelfth wiring, the twenty-first wiring overlapping with the twelfth wiring when viewed from the above, the twenty-first wiring being provided to be separated from the third wiring in the second direction, the twenty-first wiring being provided under a portion where the ninth wiring and the twelfth wiring are separated, the twenty-first wiring being provided to be separated from the eighteenth wiring in the first direction;

a twenty-second wiring provided between the substrate and the thirteenth wiring, the twenty-second wiring overlapping with the thirteenth wiring when viewed from the above, the twenty-second wiring being provided to be separated from the twenty-first wiring in the second direction, the twenty-second wiring being provided under a portion where the tenth wiring and the thirteenth wiring are separated, the twenty-second wiring being provided to be separated from the nineteenth wiring in the first direction;

a twenty-third wiring provided between the substrate and the fourteenth wiring, the twenty-third wiring overlapping with the fourteenth wiring when viewed from the above, the twenty-third wiring being provided to be separated from the twenty-second wiring in the second direction, the twenty-third wiring being provided under a portion where the eleventh wiring and the fourteenth wiring are separated, the twenty-third wiring being provided to be separated from the twentieth wiring in the first direction;

an eighth connection wiring provided above the substrate, the eighth connection wiring being provided at least partially under a portion where the eighteenth wiring and the twenty-first wiring are separated;

a ninth connection wiring provided between the ninth wiring and the twelfth wiring so that a longitudinal direction extends along the third direction, the ninth connection wiring connecting the fifteenth wiring and the eighth connection wiring;

a tenth connection wiring configured to connect the eighteenth wiring and the eighth connection wiring;

an eleventh connection wiring configured to connect the twenty-first wiring and the eighth connection wiring;

a twelfth connection wiring provided above the substrate, the twelfth connection wiring being provided at least partially under a portion where the nineteenth wiring and the twenty-second wiring are separated;

a thirteenth connection wiring provided between the tenth wiring and the thirteenth wiring so that a longitudinal direction extends along the third direction, the thirteenth connection wiring connecting the sixteenth wiring and the twelfth connection wiring;

a fourteenth connection wiring configured to connect the nineteenth wiring and the twelfth connection wiring;

a fifteenth connection wiring configured to connect the twenty-second wiring and the twelfth connection wiring;

a sixteenth connection wiring provided above the substrate, the sixteenth connection wiring being provided at least partially under a portion where the twentieth wiring and the twenty-third wiring are separated;

a seventeenth connection wiring provided between the eleventh wiring and the fourteenth wiring so that a longitudinal direction extends along the third direction, the seventeenth connection wiring connecting the seventeenth wiring and the sixteenth connection wiring;

an eighteenth connection wiring configured to connect the twentieth wiring and the sixteenth connection wiring; and a nineteenth connection wiring configured to connect the twenty-third wiring and the sixteenth connection wiring.

8. The semiconductor memory device according to claim 7, wherein the first connection wiring is provided above the eighth connection wiring, and the sixteenth connection wiring is provided above the twelfth connection wiring.

9. The semiconductor memory device according to claim 1, wherein the first connection wiring has a width larger than a width of the first wiring or the third wiring, in the second direction.

10. The semiconductor memory device according to claim 7,
wherein the second connection wiring is provided between the seventeenth connection wiring and the nineteenth connection wiring in the first direction, and the thirteenth connection wiring is provided between the ninth connection wiring and the nineteenth connection wiring in the first direction.

11. The semiconductor memory device according to claim 7, wherein the eighteenth connection wiring is provided between the tenth connection wiring and the seventeenth connection wiring in the first direction, and the fourth connection wiring is provided between the second connection wiring and the fifteenth connection wiring in the first direction.

12. The semiconductor memory device according to claim 7, wherein the tenth connection wiring and the fourteenth connection wiring are provided between the seventeenth connection wiring and the eighteenth connection wiring in the first direction, and the eleventh connection wiring and the fifteenth connection wiring are provided between the second connection wiring and the fourth connection wiring in the first direction.

13. The semiconductor memory device according to claim 1, further comprising:
a ninth wiring provided to be separated from the fourth wiring in the second direction;
a tenth wiring provided to be separated from the fifth wiring in the second direction;
an eleventh wiring provided to be separated from the ninth wiring and the tenth wiring in the second direction, the ninth wiring being provided between the fourth wiring and the eleventh wiring, the tenth wiring being provided between the fifth wiring and the eleventh wiring;
a twelfth wiring provided to be separated from the eleventh wiring in the second direction;
a fifteenth wiring provided over the ninth wiring and the tenth wring, the fifteenth wiring overlapping with the ninth wiring and the tenth wring when viewed from the above, the fifteenth wiring being provided above the eighth wirings, the fifteenth wiring being provided so that a longitudinal direction extends along the first direction;
a sixteenth wiring provided over the eleventh wiring, the sixteenth wiring overlapping with the eleventh wiring when viewed from the above, the sixteenth wiring being provided above the eighth wirings, the sixteenth wiring being provided so that a longitudinal direction extends along the first direction;
a seventeenth wiring provided over the twelfth wiring, the seventeenth wiring overlapping with the twelfth wiring when viewed from the above, the seventeenth wiring being provided above the eighth wirings, the seventeenth wiring being provided so that a longitudinal direction extends along the first direction;
an eighteenth wiring provided between the substrate and the ninth wiring, the eighteenth wiring overlapping with the ninth wiring when viewed from the above, the eighteenth wiring being provided to be separated from the first wiring in the second direction;
a nineteenth wiring provided between the substrate and the tenth wiring, the nineteenth wiring overlapping with the tenth wiring when viewed from the above, the nineteenth wiring being provided to be separated from the third wiring in the second direction;
an eighth connection wiring provided above the substrate, the eighth connection wiring being provided at least partially under the eighteenth wiring and the nineteenth wiring;
a tenth connection wiring provided between the eighth connection wiring and the eighteenth wiring, the tenth connection wiring connecting the eighth connection wiring and the eighteenth wiring; and
an eleventh connection wiring provided between the eighth connection wiring and the nineteenth wiring, the eleventh connection wiring connecting the eighth connection wiring and the nineteenth wiring.

* * * * *